(12) United States Patent
Takubo et al.

(10) Patent No.: US 6,329,610 B1
(45) Date of Patent: *Dec. 11, 2001

(54) HYBRID WIRING BOARD, SEMICONDUCTOR APPARATUS, FLEXIBLE SUBSTRATE, AND FABRICATION METHOD OF HYBRID WIRING BOARD

(75) Inventors: Chiaki Takubo, Tokyo; Yoshizumi Sato, Yokohama; Tomitsugu Kojima, Kawasaki; Go Takeda, Yokohama, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,095

(22) Filed: Jun. 1, 1998

(30) Foreign Application Priority Data

Jun. 3, 1997 (JP) .................................................. 9-145452
Dec. 15, 1997 (JP) .................................................. 9-345626

(51) Int. Cl.[7] .............................. H01R 12/04; H05K 1/11
(52) U.S. Cl. ........................ 174/264; 174/255; 174/260
(58) Field of Search .................................. 174/262, 255, 174/263, 264, 260; 361/749, 783, 792; 439/65, 67, 74

(56) References Cited

U.S. PATENT DOCUMENTS

| 5,041,183 | * | 8/1991 | Nakamura | 156/264 |
| 5,260,170 | * | 11/1993 | Brown | 430/315 |
| 5,286,926 | * | 2/1994 | Kimura et al. | 174/250 |
| 5,375,042 | * | 12/1994 | Arima et al. | 361/784 |
| 5,378,869 | | 1/1995 | Marrs et al. . | |
| 5,389,742 | * | 2/1995 | Clabburn et al. | 174/209 |
| 5,466,892 | * | 11/1995 | Howard et al. | 174/261 |
| 5,473,120 | * | 12/1995 | Ito et al. | 174/264 |
| 5,495,665 | * | 3/1996 | Carpenter et al. | 29/830 |
| 5,510,216 | * | 4/1996 | Calabrese et al. | 430/16 |
| 5,576,519 | * | 11/1996 | Swamy | 174/265 |
| 5,600,103 | | 2/1997 | Odaira et al. | 174/265 |
| 5,744,758 | * | 4/1998 | Takeknouchi et al. | 174/255 |
| 5,876,842 | * | 3/1999 | Duffy et al. | 428/209 |
| 6,010,769 | * | 1/2000 | Sasaoka et al. | 428/209 |

FOREIGN PATENT DOCUMENTS

09064542 A    3/1997    (JP) .

OTHER PUBLICATIONS

Austrian Patent Office Search Report, dated Feb. 25, 2000.

* cited by examiner

Primary Examiner—Jeffrey Gaffin
Assistant Examiner—Jeremy Norris
(74) Attorney, Agent, or Firm—Finnegan, Henderson, Farabow, Garrett & Dunner, L.L.P.

(57) ABSTRACT

A first via land of a wiring layer on a first surface of a first insulation layer that is a rigid layer and a second via land of a wiring layer on a second surface of a second insulation layer that is a flexible layer are electrically and mechanically connected with a conductive pillar pierced through a third insulation layer disposed between the first insulation layer and the second insulation layer. In such a structure, a wiring board that can mount a highly integrated semiconductor device, that is small and thin, and that has high reliability can be accomplished.

37 Claims, 19 Drawing Sheets

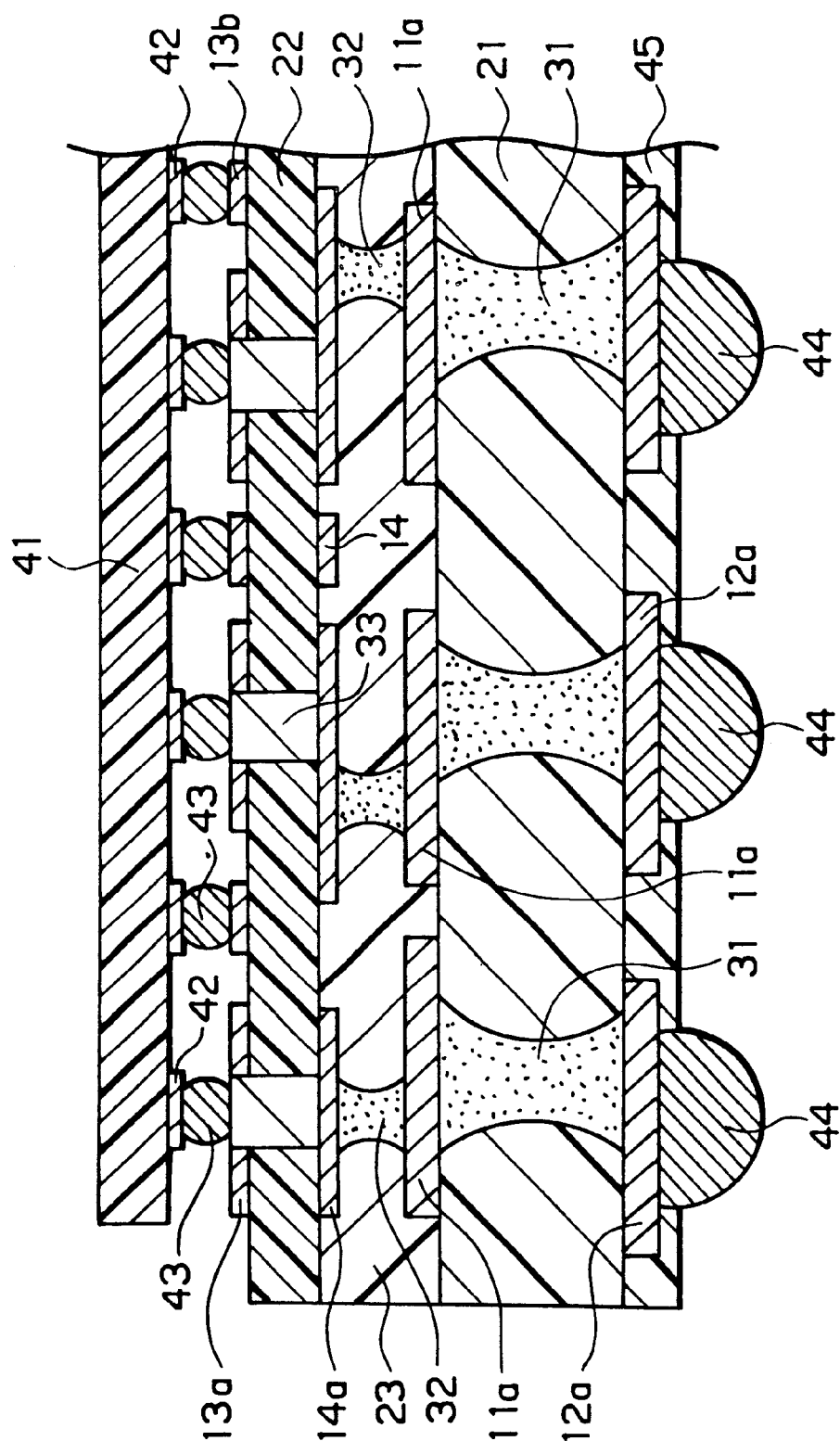

HYBRID WIRING BOARD, SEMICONDUCTOR APPARATUS, FLEXIBLE SUBSTRATE, AND FABRICATION METHOD OF HYBRID WIRING BOARD

BACKGROUND OF THE INVENTION

1. Field of the Invention

The present invention relates to a wiring board such as a printed wiring board, in particular, to a hybrid wiring board that is a combination of a rigid wiring substrate and a flexible wiring substrate.

In addition, the present invention relates to a flexible wiring substrate of which a wiring layer is disposed on insulation resin film, in particular, to a flexible wiring substrate laminated with a rigid wiring substrate.

Furthermore, the present invention relates to a semiconductor apparatus such as a semiconductor package of which a semiconductor device is mounted on a printed wiring board, in particular, to a semiconductor apparatus that mounts a semiconductor device with connection terminals disposed at a high mounting density.

Moreover, the present invention relates to a fabrication method of a printed wiring board, in particular, to a fabrication method of a hybrid wiring board that is a combination of a rigid wiring substrate and a flexible wiring substrate.

2. Description of the Related Art

The degree of integration of semiconductor devices is increasing year by year. Thus, the number of connection terminals (pads) for connecting a semiconductor device and an external circuit increases and the mounting density thereof becomes high. When the minimum machining size on a semiconductor device made of silicon or the like is around 0.2 $\mu$m, as many as 1000 connection terminals should be disposed for a semiconductor device in a square shape whose one side is 10 mm.

Moreover, in a semiconductor apparatus such as a semiconductor package of which such a semiconductor device is mounted on a wiring board, to improve the mounting density, there are strong needs for reducing the size and thickness thereof. In particular, for a portable information unit such as a note type PC (Personal Computer), a PDA, or a portable telephone unit, it is important to decrease the size and thickness of a semiconductor package.

To package a semiconductor device, it is necessary to mount a semiconductor device on a wiring board and connect terminals of the semiconductor device and the wiring board. However, to dispose around 1000 connection terminals around a semiconductor device in a square shape whose one side is around 10 mm, the mounting pitches of the connection terminals become as small as around 40 $\mu$m. To connect terminals disposed at fine pitches to terminals of a wiring board, high accuracy is required in forming a circuit pattern and aligning wires. However, conventional wire bonding technologies and TAB (Tape Automated Bonding) technologies cannot satisfy such requirements.

As a conventional terminal connecting method, connection terminals of a semiconductor device and connection terminals of a wiring board may be connected through a pillar made of a conductive substance such as solder. For example, when connection terminals of 32 lines×32 rows at pitches of 32 $\mu$m are disposed on a semiconductor device in a square shape whose one side is around 10 mm, the number of connection terminals amounts to as many as 1024.

Wires of a wiring board on which a semiconductor device is mounted are disposed at an L/S ratio (Line/Space, wiring width/wiring pitch) of as fine as around 50 $\mu$m/50 $\mu$m so as to connect the connection terminals of the semiconductor device and the external connection terminals of the semiconductor package.

As a wiring board for mounting a semiconductor device with connection terminals disposed at fine mounting pitches, for example a build-up board 900a shown in FIG. 10 has been used.

FIG. 10 is a sectional view showing the structure of a build-up board. The build-up board is a wiring board that has a printed wiring substrate 901, thin resin layers 902, and conductor wiring patterns 903. The printed wiring substrate 901 is a rigid board. The thin resin layers 902 are coated on both surfaces of the printed wiring substrate 901. The conductor wiring patterns 903 are made of metal or the like and disposed on the resin layers 902.

The printed wiring substrate 901 of the build-up board is referred to as core layer. The portions layered on both the surfaces of the core layer are referred to as build-up layers.

The insulation resin layers that structure the build-up layers are connected by a fine layer connecting means formed by photolithography technology or the like. A plurality of wiring layers are connected through the fine layer connecting means. In the example shown in FIG. 10, the layer connecting means of the build-up layers is accomplished by a photo via-hole 904.

To connect the wiring layers on the build-up layers (disposed on both the surfaces of the core layer), for example a through-hole 905 may be formed. To allow a wiring substrate to be flat, a build-up board of which the through-hole is filled with resin is known.

In the technology at the time the present invention was filed, the minimum wiring width of the wiring layer 903 that structures the build-up layers is around 40 $\mu$m. The front surface of the insulation resin layer 902 is uneven due to a wiring pattern of a lower layer. Thus, it is very difficult to form a finer wiring pattern than the uneven surface.

The diameter of via-holes formed in the insulation resin layers 902 that structure the build-up layers is around 80 $\mu$m. To form finer via-holes, the thickness of the insulation resin layers 902 may be decreased. When the thickness of the insulation resin layers 902 is decreased, the influence of the uneven surface of the lower layer becomes strong. Thus, the wiring width should be increased.

In addition, the thickness of the build-up board is restricted. To prevent the build-up board from deforming and breaking in and after the fabrication process, the build-up board should have a thickness of at least 0.6 mm. The thickness of each of the insulation resin layers 902 is in the range from around 30 to 50 $\mu$m. The thickness of the conductor wiring layer 903 is in the range from around 10 to 20 $\mu$m. To dispose around 1000 connection terminals, three wiring layers are required. Thus, the thickness of the build-up board becomes as large as 0.84 to 1.02 mm.

In addition, the above-described semiconductor device is disposed on one surface of the build-up board. For example, solder balls are disposed in a two-dimensional grid shape on the other surface of the build-up board (the resultant package is referred to as BGA package).

To decrease the thickness of the BGA package, it is necessary to decrease the thickness of the above-described core layer or the build-up layers. However, when the thickness of the core layer is decreased, the reliability of the resultant semiconductor package deteriorates. In addition, it is difficult to form the build-up layers.

When the thickness of the build-up layers is decreased, it is difficult to form a wiring pattern at fine pitches. Thus, practically, it is very difficult to decrease the thickness of the build-up board to 0.8 mm or less.

To decrease the outer side of a semiconductor package, it is necessary to decrease the diameters and pitches of through-holes formed in a wiring board on which a semiconductor device is mounted.

Generally, as a material of an insulation resin layer that structures a core layer, a prepreg of which a glass cloth woven with glass fibers is impregnated with an insulation resin is used. In such a wiring board with a prepreg, the glass fibers and hardened insulation resin layer securely adhere.

However, when through-holes are formed in a wiring board by a drill or the like, the glass fibers are broken as well as the insulation resin. Moreover, in the vicinity of through-holes, the glass fibers separate from the insulation resin.

A plate layer is formed on the inner wall of a through-hole. When the plate layer is formed, if there is a portion of which the glass fibers separate from the insulation resin in the vicinity of the through-hole, a plate solution that contains metal ions permeates the portion. When the pitches of through-holes are decreased, the pitches of the separate portions of the glass fibers and the insulation resin become small. In this case, the conductive substance that permeates the separate portions deteriorates the insulation between the through-holes.

Thus, it is very difficult to mount a semiconductor device with connection terminals disposed at very fine pitches on a build-up board. In addition, to structure such a semiconductor device as a semiconductor package, it is difficult to use a build-up board.

On the other hand, a semiconductor package of which a semiconductor device is mounted on a film laminate substrate is known. The film laminate substrate is a laminate of a plurality of film substrates with wiring layers disposed through an insulation film made of for example polyimide.

FIGS. 11 and 12 are sectional views showing the structures of film laminate substrates.

As a practical example of the material of insulation film 902, polyimide with a high chemical resistance is used. As a practical example of the material of a wiring layer 903, copper is used.

In film laminate substrates 900b and 900c shown in FIGS. 11 and 12, unlike with the build-up board 900a that is uneven due to the wiring layer 903, since the front surface of the insulation film 902 is even, a fine wiring pattern can be formed.

To form a fine wiring pattern, it is necessary to decrease the thickness of the wiring layer 903. When the wiring layer 903 is made of copper foil with a thickness of around 15 to 18 $\mu$m, an L/S ratio of 25 $\mu$m/25 $\mu$m can be accomplished. With a wiring layer made of copper foil with a thickness of round 10 $\mu$m to 15 $\mu$m, an L/S ratio of 20 $\mu$m/20 $\mu$m can be accomplished.

To connect the wiring layers 903 disposed on both the surfaces of the insulation film 902, fine via-holes 904 are formed in the insulation film. The via-holes are filled with a conductive material. When an insulation layer 902 is made of polyimide film with a thickness of around 50 $\mu$m, via-holes 904 with a diameter of around 50 $\mu$m can be formed by laser radiation or photochemical technology. To further decrease the diameters of the via-holes 904, the thickness of the insulation film 902 can be further decreased.

As a method for connecting the wiring layers 903 disposed on the insulation film 902, bumps made of copper or the like are formed on the wiring layers 903 by plating process. Bonding metal layers are formed on the bumps. The bumps are pressure-fitted to a wiring layer formed on the other insulation film through insulation film.

However, in such a layer connecting method, it takes a time to form the bumps. In addition, it takes a time to form a metal layer (pad) to be bonded to the bumps. Thus, in this method, the yield is low and thereby the fabrication cost is high.

Instead of bumps of copper, wiring layers may be connected with Pb/Sn type solder. In this case, when the solder is melted and connected to the wiring layers, the solder may adversely spread out. Thus, this method is not suitable for fine connections.

When a semiconductor package of which a semiconductor device is mounted on the front surface of a wiring board that is a laminate of a plurality of insulation film layers (made of polyimide) with wiring layers (the semiconductor package having BGA connection terminals on the rear surface) is mounted to a mother board, conductor balls that connect the semiconductor package and the mother board are stressed. Thus, sufficient connecting reliability cannot be obtained.

The mother board of the semiconductor package is a printed wiring board having an insulation resin layer of which a glass cloth is impregnated with glass epoxy or the like.

Nearly, at an ordinary temperature (25° C.), the coefficient of thermal expansion of polyimide is around 8 ppm. On the other hand, the coefficient of thermal expansion of glass epoxy is in the range from around 14 to 17 ppm. Thus, at the ordinary temperature, the difference of the coefficients of thermal expansion between polyimide and glass epoxy is around 1.7 to 2.1 times. Consequently, the solder balls that connect the semiconductor package and the mother board are subject to large stress.

After the semiconductor package is mounted on the mother board, due to a temperature change in operation, much larger stress takes place in the solder balls. When such a load cumulates in the solder balls, they crack and thereby the connecting reliability largely deteriorates.

Since the thickness of the semiconductor device and the wiring board that structure the semiconductor package is decreased and there is the difference of the coefficients of linear expansion thereof, they are stressed. Thus, the connecting reliability deteriorates.

In the build-up board, when the thickness of the insulation layer is decreased so as to decrease the diameters of via-holes, it becomes difficult to finely form a wiring pattern. In addition, since through-holes of the core layer are formed by a drill, the diameters and pitches of the through-holes cannot be decreased. Moreover, when the thickness of the semiconductor package is decreased, the required strength cannot be obtained in the fabrication process, in particular, the build-up layer forming process.

In the case of a wiring board of which a plurality of film substrates with wiring layers are laminated on insulation film made of polyimide or the like, the yield is low and thereby the fabrication cost is high. In addition, since the difference of the coefficients of linear expansion of the material of the insulation film and the mother board on which the wiring board is disposed is large, the connecting reliability is low.

When a plurality of wiring substrates of same type or different type are laminated, the following problems take place.

There are technologies for laminating a plurality of wiring substrates (single-sided plate, double-sided plate, multi-layered plate, flexible substrate, or the like). As an example, a plurality of insulation layers having adhesive characteristic (for example, prepreg layers) are aligned through adhesive agent. The aligned substrates are pressured and heated. Thus, a laminated is mechanically formed. The laminate is drilled and plated so as to form PTHs (Plated Through-Holes). In such a manner, the layers are electrically connected.

A laminate of a plurality of rigid wiring substrates connected with PTHs or the like is referred to as IVH laminate wiring board.

A laminate of a rigid wiring substrate with layers connected with PTHs or the like and a flexible wiring substrate is referred to as rigid flexible substrate.

When a plurality of wiring substrates are laminated, through-holes should be formed by a number of processes such as the drilling process and the plating process. Thus, the yield is low.

In the plating process, waste fluid that adversely influences the environment is inevitable. To suppress the adverse influence of the waste fluid against the environment, a facility and time for processing the waste fluid are required. Thus, the yield becomes low and thereby the fabrication cost becomes high.

When layers are connected by the plating process, the thickness of conductor of the outer layer increases. Thus, since the surface of the resultant substrate becomes uneven, a fine circuit pattern cannot be formed.

When different materials such as a rigid wiring substrate and a flexible wiring substrate are integrated, if the drilling process and the plating process (pre-processes) are performed in the same condition, the states of the PTHs differ between these materials. Thus, the reliability of the connections of the layers with the PTHs deteriorates.

Conventionally, flexible substrates are laminated in for example the following manner. Holes are formed in the material of a flexible substrate such as polyimide film on which a conductive layer such as copper foil is formed from the film side by laser radiating process, photo-etching process, or the like. The holes are filled with a conductive substance such as conductive paste. Alternatively, the holes are plated. The resultant substrates are laminated with adhesive agent.

FIG. 13 is a schematic diagram for explaining a conventional laminating method of flexible substrates. Copper-clad substrate materials of which copper foil is adhered to flexible insulation layers 91a and 91b such as polyimide film are prepared. Wiring patterns 92 including via lands 92a are formed on the substrate materials by photo-etching process or the like.

Holes are formed at positions of which the insulation layers 91a and 91b are connected by laser radiating process, photo-etching process, or the like. The holes are filled with conductive paste 93 such as solder paste. The wiring patterns 92 are formed on both surfaces of a portion that is finally exposed (for example, the insulation layer 91). The resultant substrates are laminated with adhesive agent 94.

FIG. 14 is a schematic diagram for explaining another conventional laminating method of flexible substrates. In this example, a copper layer 96 is plated on an inner surface of through-hole. A gold layer 97 is plated in the through-hole on the reverse side of the wiring layer 95.

In addition, a land portion 95 that is a laminate of a copper layer 95a and a tin layer 95b is formed on the through-hole on the side of the wiring layer 95. The resultant substrates are laminated with Au—Sn eutectic solder of the gold layer 97 and the tin layer 95b.

However, in such a method, the through-hole should be filled with a conductive substance such as conductive paste 93 so as to connect layers. Alternatively, a conductive layer should be formed by plating process. Thus, the yield becomes low. Particularly, in the method shown in FIG. 14, different plating processes should be performed on both sides of the through-hole. Consequently, the yield becomes very low.

In addition, the material that bonds flexible substrates does not absorb the thickness of the via land 92a and the wiring pattern 92. Thus, the laminate wiring board becomes uneven due to the unevenness of the wiring pattern 92 that includes the via land 92a disposed on the insulation layers 91a and 91b made of the polyimide film.

In the case that the coplanarity of the wiring board due to the unevenness of an inner layer deteriorates, when a semiconductor device is mounted by flip-chip bonding method, the connecting reliability deteriorates.

SUMMARY OF THE INVENTION

The present invention is made from the above-described point of view. An object of the present invention is to provide a wiring board capable of mounting a highly integrated semiconductor device.

Another object of the present invention is to improve the reliability and yield of a hybrid wiring board that is a combination of a rigid wiring substrate and a flexible wiring substrate and a hybrid wiring board that is a combination of flexible substrates.

Another object of the present invention is to provide a wiring board that is applied for a high density device and that can be easily connected to an external circuit.

Another object of the present invention is to provide a wiring board that can be easily applied for various high density portable information units such as a portable telephone unit, a portable VCR, and a note type personal computer.

Another object of the present invention is to provide a small and thin semiconductor package that can mount a semiconductor device with connection terminals disposed at a high density.

Another object of the present invention is to provide a semiconductor package that mounts a highly integrated semiconductor device and that has high connecting reliability to a mother board.

Another object of the present invention is to provide a flexible wiring substrate suitable for a laminate of a plurality of substrates, in particular, a flexible wiring substrate with a high bonding strength to a rigid wiring substrate or another flexible substrate.

Another object of the present invention is to provide a fabrication method of a printed wiring board that is a laminate of a plurality of a rigid wiring substrate and a flexible wiring substrate or a laminate of flexible substrates.

A first aspect of the hybrid wiring board of the invention is to comprise a first wiring substrate having a first face and a second face, and the first wiring substrate having a first wiring layer formed onto the first face; a second wiring substrate having a first face and a second face, and the second wiring substrate having a second wiring layer formed onto the second face; an insulating resin layer interposed between the first face of the first wiring substrate and the second face of the second wiring substrate; and at least a conductive pillar pierced through the insulating resin layer so as to connect the first wiring layer and the second wiring layer.

In addition, it is also available to comprise, a first substrate having a first surface and a second surface, a second substrate having a first surface and a second surface, an insulation resin layer disposed between the first surface of the first substrate and the second surface of the second substrate, a first wiring layer disposed on the first surface of the first substrate, the first wiring layer having a first via land that protrudes to the insulation resin layer, a second wiring layer disposed on the second surface of the second substrate, the second wiring layer having a second via land that protrudes to the insulation resin layer, and a conductive pillar pierced through the insulation resin layer so as to connect the first via land and the second via land.

The first wiring substrate may be a rigid substrate and the second wiring substrate may be a flexible substrate.

The first wiring substrate and the second wiring substrate may be flexible substrates.

The first wiring substrate and the second wiring substrate may be rigid substrates.

In other words, the first aspect of the present invention is a hybrid wiring board of which wiring substrates of same type or different type are laminated with an insulation resin layer and a conductive pillar. A first wiring substrate and a second wiring substrate that are oppositely disposed are electrically and mechanically interfaced with an insulation resin layer and a conductive pillar pierced through the insulation resin layer.

In other words, the mechanical connection between the first wiring substrate and the second wiring substrate is mainly performed with the insulation resin layer. On the other hand, the electrical connection between the first wiring substrate and the second wiring substrate is mainly performed with the conductive pillar. The conductive pillar that is plastic-deformed and bonded to a via land contributes to the mechanical connection.

In the wiring board of the first aspect of the present invention, a first via land disposed on the first wiring substrate and a second via land disposed on the second wiring substrate protrude to the insulation resin layer.

In this structure, both a connecting surface of the first via land and the conductive pillar and a connecting surface of the second via land and the conductive pillar protrude to the insulation resin layer. Thus, this structure allows the height of the conductive pillar to decrease in comparison with a structure of which at least one of the first via land and the second via land does not protrude the insulation resin layer. Thus, in the structure of the first aspect of the present invention, the diameter of the conductive pillar can be more decreased. In addition, when the diameter of the conductive pillar is not decreased, the connecting reliability can be more improved.

In particular, since the diameter of the conductive pillar can be decreased, the density of conductive pillars can be increased. Thus, a wiring board suitable for a high density device with a fine L/S ratio can be accomplished.

In addition, since the height of the conductive pillar can be more decreased, the number of times of the screen printing process can be decreased for forming the conductive pillar. Thus, the yield of the wiring board with the conductive pillar that connects the layers can be improved.

In the wiring board of the first aspect of the present invention, the substrates connected with the insulation resin layer and the conductive pillar are not limited. In other words, the substrates may be a combination of rigid substrates (a resin substrate, a ceramic substrate, and so forth) or a combination of flexible substrates, or a combination of a rigid substrate and a flexible substrate.

For example, when flexible substrates can be easily laminated with the insulation resin layer and the conductive pillar, a fine L/S ratio can be obtained as the feature of the flexible substrates. Thus, the wiring board of the first aspect of the present invention can be applied for a wiring board that mounts a semiconductor device with connection terminals disposed at a high density and that operates at high speed.

Moreover, in the wiring board of the first aspect of the present invention, since two wiring substrates are oppositely disposed with a resin layer made of prepreg in a semi-cure state, the unevenness of one substrate is absorbed by the resin layer. Thus, a highly even wiring board can be accomplished. When a semiconductor device is mounted on the wiring board, the connecting reliability can be improved.

Conductive pillar is formed in a hyperboloid of one shape, and ball shape having a convex side surface, for example. In the invention, a shape of conductive pillar is not restricted as described, and it can be variably changed according to an electrical or a mechanical necessities. In addition, an area of an upper surface of the pillar and an area of bottom surface of the pillar can be different.

A second aspect of the hybrid wiring board of the invention is to comprise a first board which is flexible, the first board having a first face and a second face, and the first face having a first region and a second region; a first wiring layer formed on the first face of the first board; an insulating resin layer formed on the first region of the first board, the insulating resin layer having a first face and a second face, the first face is opposed to the first region of the first board, and the insulating resin layer is rigid; a second wiring layer having a second via land formed on the second face of the insulating resin layer, the second via land is opposed to the first via land, and the second wiring layer formed convex to the insulating resin layer; and a conductive pillar pierced through the insulating resin layer so as to connect the first wiring layer and the second wiring layer.

Also, it is possible that a hybrid wiring substrate comprises, a first substrate that is a flexible substrate and that has a first surface and a second surface, the first surface and the second surface having a first region and a second region, respectively, an insulation resin layer that is a rigid insulation resin and that is disposed in the first region of the first surface of the first substrate, a first wiring layer disposed on the first surface of the first substrate, the first wiring layer having a first via land that protrudes to the insulation resin layer, a second wiring layer disposed on a region corresponding to the first region of the second substrate through the insulation resin layer, the second wiring layer having a second via land disposed opposite to the first via land, and a conductive pillar pierced through the insulation resin layer so as to connect the first via land and the second via land.

In the wiring board of the second aspect of the present invention, a wiring layer is disposed through region of a flexible substrate and insulation resin layer made of thermosetting resin or the like. The wiring layer and wires of the flexible substrate are connected with a conductive pillar. A rigid insulation resin layer may be disposed at two or more regions of the flexible substrate.

In this structure, a region of the wiring substrate may have flexibility or rigidity.

In addition, since the layers of the wring board of the second aspect of the present invention are disposed through the insulation resin layer and connected with the conductive pillar, the wiring board can be applied for a high density device. In this case, as described before, a via land protrudes to the insulation resin layer so that the height of the conductive pillar is smaller than the thickness of the insulation resin layer. Moreover, since the hybrid wiring board of the second aspect of the present invention has a second wiring layer disposed in a region of a flexible substrate through an insulation resin layer made of for example prepreg, the hybrid wiring board can be easily connected to an external circuit, a mother board, or a case with high connecting reliability.

A third aspect of the present invention is a hybrid wiring board, comprising a first substrate that is a rigid substrate and that has a first surface and a second surface, the first substrate having a first wiring layer and a second wiring layer, the first wiring layer being disposed on the first surface and having a first via land, the second wiring layer being disposed on the second surface, a second substrate that is a rigid substrate and that has a first surface and a second surface, the second substrate having a third wiring layer and a fourth wiring layer, the third wiring layer disposed on the first layer, the fourth wiring layer disposed on the second surface and having a second via land, an insulation resin layer disposed between the first surface of the first substrate and the second surface of the second substrate, and a conductive pillar pierced through the insulation resin layer so as to connect the first via land of the first substrate and the second via land of the second substrate.

A fourth aspect of the present invention is a hybrid wiring board, comprising a first substrate that is a rigid substrate and that has a first surface and a second surface, the first substrate having a first wiring layer disposed on the first surface, the first substrate having a first via land, a second substrate that is a flexible substrate and that has a first surface and a second surface, the second substrate having a fourth wiring layer disposed on the second surface, the fourth wiring layer having a second via land, a third insulation layer disposed between the first surface of the first substrate that is a rigid substrate and the second surface of the second substrate that is a flexible substrate, and a conductive pillar pierced through the third insulation layer so as to connect the first via land on the first substrate that is a rigid substrate and the second via land on the second substrate that is a flexible substrate.

The third insulation layer may be a rigid insulation layer.

The first substrate that is a rigid substrate may be a laminate of a plurality of wiring layers and a plurality of insulation layers.

The second substrate that is a flexible substrate may be a laminate of a plurality of wiring layers and a plurality of insulation layers.

The wiring layers of the first substrate that is a rigid substrate may be connected with a conductive pillar pierced through an insulation layer that insulates the wiring layers.

A fifth aspect of the hybrid wiring board in the invention is to comprise, a first insulating layer having a first face and a second face, and the first insulating layer having a first flexibility; a first wiring layer formed onto the first face of the first insulating layer; a second insulating layer having a first face and a second face, and the second insulating layer having a second flexibility which is larger than the first flexibility; a second wiring layer formed onto the second face of the second insulating layer; a third insulating layer interposed between the first face of the first insulating layer and the second face of the second insulating layer, and the third insulating layer having a third flexibility which is smaller than the second flexibility; and a conductive pillar pierced through the insulating resin layer so as to connect the first wiring layer and the second wiring layer.

It is also available that a hybrid wring board comprises, a first insulation layer having a first surface and a second surface, the first insulation layer having a first wiring layer disposed on the first surface, the first wiring layer having a first via land, a second insulation layer having a first surface and a second surface, the second insulation layer having a second wiring layer disposed on the second surface, the second wiring layer having a second via land, the flexibility of the second insulation layer being larger than the flexibility of the first insulation layer, a third insulation layer disposed between the first surface of the first insulation layer and the second surface of the insulation layer, the flexibility of the third insulation layer being smaller than the flexibility of the second insulation layer, and a conductive pillar pierced through the third insulation layer so as to connect the first via land and the second via land.

The bonding strength between the second insulation layer and the third insulation layer is preferably larger than the bonding strength between the first insulation layer and the third insulation layer. Thus, the connecting surface between the second insulation layer and the third insulation layer may be reformed.

The surface roughness of the second surface of the second insulation layer is preferably larger than the surface roughness of the first surface of the second insulation layer.

The difference between the coefficient of thermal expansion of the first insulation layer and the coefficient of thermal expansion of the third insulation layer is preferably larger than the difference between the coefficient of thermal expansion of the second insulation layer and the coefficient of thermal expansion of the third insulation layer. Thus, the reliability against thermal load is improved.

The second insulation layer may be made of an insulation material whose flexibility is larger than the flexibility of the third insulation layer.

The dielectric constant of the second insulation layer may be smaller than the dielectric constant of the first insulation layer and the dielectric constant of the third insulation layer. Thus, signals that flow in wires on the second insulation layer are suppressed from delaying and deforming. Consequently, the hybrid wiring board can be applied for a semiconductor device that operates at much higher speed.

The first insulation layer may be made of at least one polymer selected from the group consisting of polyimide type resin, bismaleimide type polyimide resin, polyphenylene ether type resin, and glass epoxy type resin.

The second insulation layer may be made of at least one polymer selected from the group consisting of polyimide type resin, polyester type resin, and polytetrafluoroethylene type resin. Since the second insulation layer is made of a material with a low dielectric constant, signals that flow in wires are suppressed from delaying and deforming.

The third insulation layer may be made of epoxy denatured polyimide type resin. In the hybrid wiring board of the fifth aspect of the present invention, the first substrate and the second substrate are preferably connected with the third insulation layer.

A sixth aspect of the present invention is to comprise, a first wiring substrate having a first face and a second face, the first wiring substrate having a first wiring layer which has a first via land formed on the first face of the first wiring substrate, and the first wiring substrate is rigid; a second wiring substrate having a first face and a second face, the second wiring substrate having a second wiring layer which has a second via land formed on the second face of the second wiring substrate, and the second wiring substrate is flexible; at least a semiconductor chip mounted on the first face of the second wiring substrate; an insulating resin layer interposed between the first face of the first wiring substrate and the second face of the second wiring substrate; and at least a conductive pillar pierced through the insulating resin layer so as to connect the first via land and the second via land.

It is also available to comprise, a first substrate that is a rigid substrate and that has a first surface and a second surface, the first substrate having a first wiring layer disposed on the first surface, the first wiring layer having a first via land, a second substrate that is a flexible substrate and that has a first surface and a second surface, a semiconductor device being disposed on the first surface, the second substrate having a second wiring layer disposed on the second surface, the second wiring layer having a second via land, an insulation layer disposed between the first surface of the first substrate that is a rigid substrate and the second surface of the second substrate that is a flexible substrate, and a conductive pillar pierced through the insulation layer so as to connect the first via land of the first substrate that is a rigid substrate and the second via land of the second substrate that is a flexible substrate.

The insulation layer exposed on the second surface of the second substrate that is a flexible substrate may be reformed so as to improve the wettability of the insulation layer.

The semiconductor device may be connected to the second substrate that is a flexible substrate by flip-chip bonding method.

The first substrate that is a rigid substrate may be a laminate of a plurality of wiring layers and a plurality of insulation layers.

The wiring layers of the first substrate may be connected with a conductive pillar pierced through the insulation layer.

The second substrate that is a flexible substrate may be a laminate of a plurality of wiring layers and a plurality of insulation layers.

Outer connection terminals may be disposed in a grid array shape on the second surface of the first substrate that is a rigid substrate. The outer connection terminals are connected to the first via land disposed on the first surface of the first substrate. Solder balls may be disposed on the outer connection terminals.

The semiconductor apparatus of the sixth aspect of the present invention may be applied to for example semiconductor packages (including CSP (Chip Size Package) and MCM (Multi-Chip Module)).

A seventh aspect of the present invention is a flexible wiring substrate that comprises a insulating film having a first face and a second face, and the insulating film is flexible; a first wiring layer formed on the first face of the insulating film; and a second wiring layer formed on the second face of the insulating film; wherein a surface free energy of the insulating film of the first face is smaller than a surface free energy of the insulating film of the second face.

It is also available to comprise, a flexible wiring substrate, comprising an insulation resin layer that is film-shaped and that has a first surface and a second surface, a first wiring layer disposed on the first surface, and a second wiring layer disposed on the second surface, wherein the free energy of the first surface of the insulation resin layer is smaller than the free energy of the second surface of the insulation resin layer.

In other words, the flexible substrate of the seventh aspect of the present invention comprises an insulation resin layer that is a film layer and that has a first surface and a second surface, a first wiring layer disposed on the first surface, and a second wiring layer disposed on the second surface, wherein the front surface of the insulation resin layer disposed on the first surface or the second surface has a mat layer.

The contacting angle of the second surface to a water drop is preferably 60° or more, more preferably 120° or more so as to improve the bonding strength with another insulation layer.

An eighth aspect of the present invention is a fabrication method of a hybrid wiring board, comprising the steps of (a) disposing a conductive pillar on a first via land disposed on a first surface of a first substrate, the first via land protruding on the first surface of the first substrate, (b) disposing the first substrate and a second substrate that is a flexible substrate and that has a second via land protruding on a second surface of the second substrate so that the first via land faces the second via land through an insulation resin that is in a semi-cure state, and (c) pressing the first substrate and the second substrate so as to plastic-deform a head portion of the conductive pillar and bond the conductive pillar and the second via land.

A ninth aspect of the present invention is a fabrication method of a hybrid wiring board, comprising the steps of (a) disposing a conductive pillar that is in an almost conical shape on a first via land of a first surface of a first substrate that is a rigid substrate, (b) disposing the first substrate and a second substrate that is a flexible substrate and that has a second via land on a second surface of the second substrate so that the first via land faces the second via land through an insulation resin layer that is in a semi-cure state, and (c) pressing the first substrate and the second substrate so as to plastic-deform a head portion of the conductive pillar and bond the conductive pillar and the second via land.

A tenth aspect of the present invention is a fabrication method of a hybrid wiring board, comprising the steps of (a) disposing a conductive pillar that is in an almost conical shape to a first via land of a first surface of a first substrate that is a rigid substrate, (b) disposing an insulation resin layer that is in a semi-cure state on the first surface of the first substrate so that the conductive pillar is pierced through the insulation resin layer and a head portion of the conductive pillar is exposed, (c) pressing the exposed head portion of the conductive pillar in the axial direction of the conductive pillar so as to plastic-deform the conductive pillar, (d) disposing the first substrate and a second substrate that is a flexible substrate and that has a second via land on a second surface of the second substrate so that the head portion of the conductive pillar faces the second via land, and (e) pressing the first substrate and the second substrate so as to plastic-deform the head portion of the conductive pillar and bond the conductive pillar and the second via land.

An eleventh aspect of the present invention is a fabrication method of a hybrid wiring board, comprising the steps of (a) disposing a first conductive pillar that is in an almost conical shape on a first via land of a first surface of a first substrate, (b) disposing a second conductive pillar that is in an almost conical shape on a second via land of a second surface of a second substrate that is a flexible substrate, (c) disposing the first surface of the first substrate and the second surface of the second substrate so that the first via land faces the second via land through an insulation resin layer that is in a semi-cure state, and (d) pressing the first substrate and the second substrate so as to plastic-deform and connect the first conductive pillar and the second conductive pillar.

Before the second substrate that is a flexible substrate and the first substrate that is a rigid substrate are oppositely disposed, the second surface of the second substrate may be reformed so as to improve the bonding strength between the second surface of the second substrate and the first surface of the first substrate, The reforming step may be performed by washing the second surface of the second substrate by an alkali solution. Alternatively, the reforming step may be performed by plasma-ashing the second surface of the second substrate.

In other words, in the hybrid wiring board according to the present invention, the wiring layer disposed on the first insulation layer that is a rigid layer and the wiring layer disposed on the second insulation layer that is a flexible layer are electrically and mechanically connected with the conductive pillar that connects the third insulation layer and the via land. Thus, the third insulation layer and the conductive pillar function as interface means for connecting the rigid portion and the flexible portion. In other words, for a fine wiring layer with a fine L/S (line and space, wire width/wire pitch) ratio, the structure of the second substrate that is a flexible substrate is used. For a portion to which the second substrate that is a flexible substrate is disposed, the structure of the first substrate that is a rigid substrate is used. These wiring layers are interfaced with the third insulation layer and the conductive pillar.

In the hybrid wiring board according to the present invention, the materials are selected and the interface state is controlled so that the bonding strength between the second insulation layer and the third insulating layer is larger than the bonding strength between the first insulation layer and the second insulation layer.

Examples of the material of the first insulation layer that is a rigid layer are polycarbonate resin, polysulfone resin, thermoplastic polyimide resin, polyethylene tetrafluoride resin, polypropylene hexafluoride resin, polyether ether ketone resin, epoxy resin, bismaleimide type polyimide resin, bismaleimide type triazine resin, polyimide resin, phenol resin, polyester resin, melamine resin, polyphenylene ether type resin, and a polymer of a thermosetting resin such as prepreg of which a glass cloth or the like is impregnated therewith.

Other examples of the material of the first insulation layer are raw rubber sheets of butadiene rubber, butyl rubber, natural rubber, neoprene rubber, and silicone rubber.

The material of the insulation resin layer may be a single synthetic resin or may contain an organic/inorganic insulation packing. Alternatively, the material of the insulation resin layer may be used along with a reinforcing material such as a glass cloth, a mat thereof, an organic synthetic fiber cloth, a mat thereof, and a paper thereof.

Examples of the material of the third insulation layer are polyimide type resin film, polyester type resin film, and a polymer of a flexible insulation resin such as polytetrafluoroethylene.

The third insulation layer that connects the rigid layer and the flexible layer may be an insulation resin material that has a higher bonding strength to the second insulation layer than the first insulation layer. For example, as the material of the third insulation layer, a thermosetting resin such as epoxy denatured polyimide may be use.

The conductive pillar that connects the wiring layer of the rigid layer and the wiring layer of the flexible layer may be formed by screen-printing conductive paste of which conductive particles are mixed and dispersed in binder. When necessary, a solvent, a coupling agent, and/or an additive may be added.

Examples of the material of the binder are thermosetting resin, thermoplastic resin, and mixture thereof such as urea resin, melamine resin, phenol resin, resorcinol resin, epoxy resin, polyurethane resin, vinyl acetate resin, poly vinyl alcohol resin, acrylic resin, vinyl urethane resin, silicone resin, $\alpha$-olefin maleic anhydride, polyamide resin, and polyimide resin.

Examples of the conductive particles (filler) are particles or super-particles of Au, Ag, Cu, solder, Ni, or carbon mixed or dispersed with the above-described binder. Alternatively, such a conductive substance may be formed on the front surface of the resin. In addition, a plurality of conductive substances may be used in combination.

Examples of the solvent are dioxane, benzene, hexane, toluene, solvent naphtha, industrial gasoline, acetate Cllosolve, ethyl Cellosolve, butyl Cellosolve acetate, butyl carbitol acetate, dimethyl formamide, dimethyl acetamide, and N-methyl pyrrolidone.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 3 is a schematic diagram showing the structure of a semiconductor package according to a third embodiment of the present invention;

DESCRIPTION OF PREFERRED EMBODIMENTS

Next, with reference to the accompanying drawings, embodiments of the present invention will be described in detail.

(First Embodiment)

Figure 1:
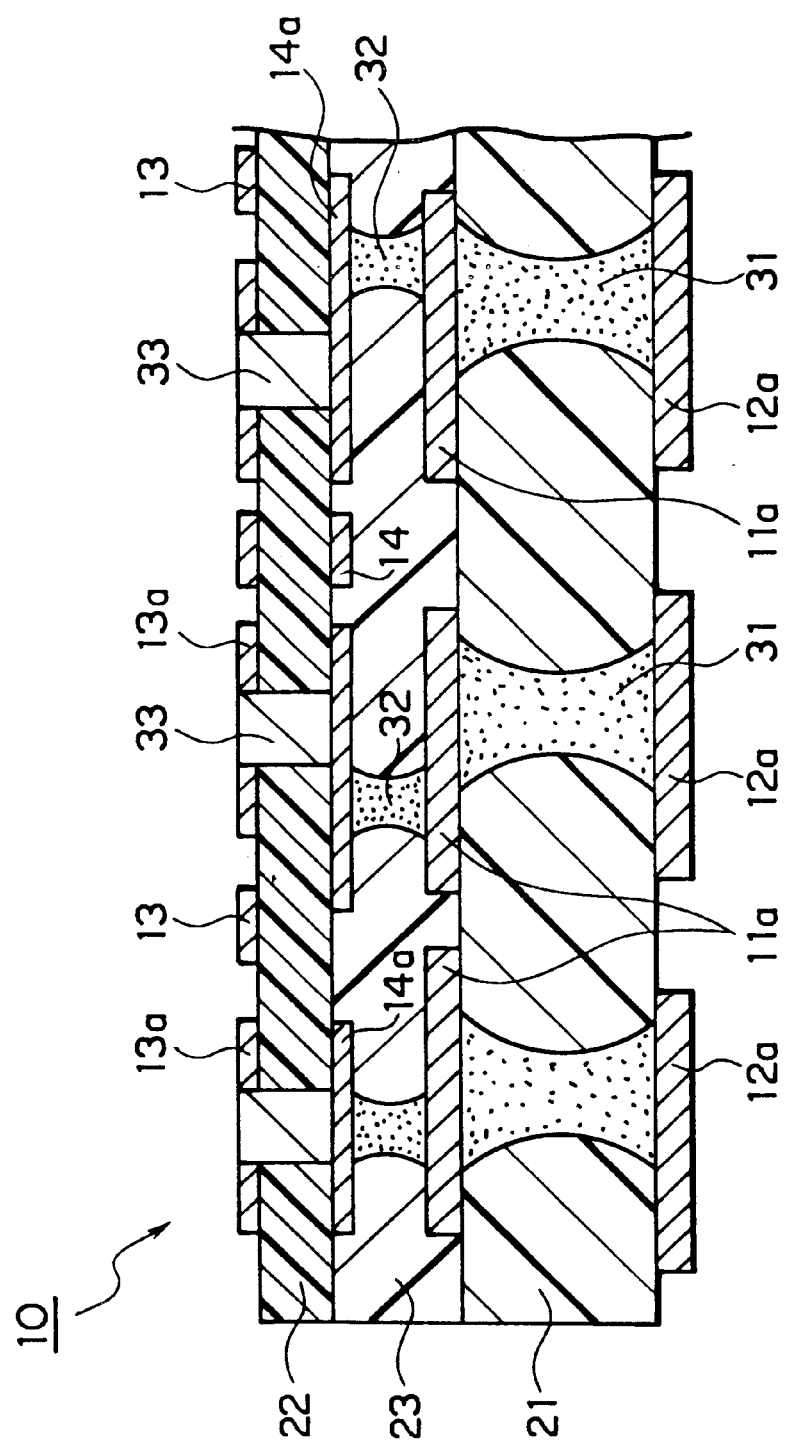
FIG. 1 is a sectional view showing the structure of a hybrid wiring board according to a first embodiment of the present invention.

FIG. 1 is a sectional view showing the structure of a hybrid wiring board according to a first embodiment of the present invention.

Referring to FIG. 1, a hybrid wiring board 10 is a laminate wiring board having four wiring layers 11, 12, 13, and 14. The wiring layer 11 and the wiring layer 12 are insulated with a first insulation layer 21 that is a rigid layer. The wiring layer 13 and the wiring layer 14 are insulated with an insulation layer 22 that is a flexible layer. The wiring layer 11 and the wiring layer 14 are insulated with a third insulation layer 23 that is more rigid than the second insulation layer 22. The wiring layers 11, 12, 13, and 14 have land portions 11a, 12a, 13a, and 14a as parts of their wiring patterns, respectively.

The wiring layers 11, 12, 13, and 14 are formed by patterning conductive metal foil such as copper foil.

The first insulation layer 21 is made of prepreg of which a glass cloth is impregnated with BT resin. The second insulation layer 22 is made of polyimide film. The third insulation layer 23 is made of prepreg of which a glass cloth is impregnated with epoxy denatured polyimide. In other words, the first insulation layer 21 and the third insulation layer 23 are made of a rigid material. The second insulation layer 22 is made of a flexible material. Thus, the hybrid wiring board 10 shown in FIG. 1 is a laminate of a rigid wiring substrate and a flexible wiring substrate.

The first insulation layer 21 that is a rigid layer is made of an insulation material that is conventionally used for a rigid printed wiring board (rigid wiring substrate). Examples of the material of the first insulation layer 21 are bismaleimide type polyimide resin (such as BT resin (Mitsubishi Gasu Kagaku)), denatured polyimide resin (such as BN300 (Mitsui Toatsu)), PPE, FR-4, high Tg FR-4, various types of bonding sheets, and thermoplastic film.

The second insulation layer 22 that is a flexible layer is made of an insulation material used for a so-called flexible wiring substrate. Examples of the material of the second insulation layer 22 are polyimide type resin film, polyester type resin film, and PTFE (polytetrafluoroethylene) type resin film.

With such insulation resin film, the wiring patterns 13 and 14 can be formed with finer L/S ratios. Since the dielectric constants of these materials are small, they do not largely affect waveforms of signals that flow in wires. Thus, a semiconductor device that operates at high speed can be mounted on the hybrid wiring board.

The materials of the first insulation layer 21, the second insulation layer 22, and the third insulation layer 23 are preferably used in combination so that sufficient bonding strength thereof can be obtained.

The via land 11a of the wiring layer 11 and the via land 12a of the wiring layer 12 are connected with a conductive pillar 31 pierced through the first insulation layer 21. Likewise, the via land 11a of the wiring layer 11 and the via land 14a of the wiring layer 14 are connected with a conductive pillar 32 pierced through the third insulation layer 23.

The via land 13a of the wiring layer 13 and the via land 14a of the wiring layer 14 are connected with a via-hole 33 pierced through the second insulation layer 22 that is a flexible layer. The via-hole 33 is formed by laser radiating process and filled with conductive paste.

The L/S ratios of the wiring layers 11 and 12 disposed on both the surfaces of the first insulation layer 21 (rigid layer) are 0.05/0.05 mm. The diameters of the via lands 11a and 12a are around 0.4 mm. The L/S ratios of the wiring layers 13 and 14 disposed on the both surfaces of the second insulation layer 22 (flexible layer) are 0.03/0.03 mm. The diameters of the via lands 13a and 14a are around 0.2 mm. Thus, the patterns of the wiring layers 13 and 14 are finer than the patterns of the wiring layers 11 and 12. Consequently, a semiconductor device with connection terminals disposed at very fine pitches can be mounted on the hybrid wiring board.

In addition, in the hybrid wiring board according to the first embodiment of the present invention, the via land 11a of the wiring layer 11 and the via land 14a of the wiring layer 14 are connected with the conductive pillar 31 pierced through the third insulation layer 23.

In the hybrid wiring board shown in FIG. 1, the wiring layer 11 and the wiring layer 12 are connected with the conductive pillar. Alternatively, the wiring layer 11 and the wiring layer 12 may be connected with another means such as a through-hole. In the hybrid wiring board shown in FIG. 1, the wiring layers disposed on both the surfaces of the second insulation layer are connected with the via-hole formed by laser radiating process. Alternatively, the wiring layers may be connected by another means such as a stacked via-hole. However, the wiring layer 11 and the wiring layer 14 disposed on both the surfaces of the third insulation layer 23 should be connected with the conductive pillar 32.

Thus, in the hybrid wiring board according to the first embodiment of the present invention, the wiring layers 11 and 12 disposed on both the surfaces of the first insulation layer 21 (rigid layer) and the wiring layers 13 and 14 disposed on both the surfaces of the second insulation layer 22 (flexible layer) are electrically and mechanically connected with the third insulation layer 23 and the conductive pillar 32 that connects the first via land 11a and the second via land 14a. In other words, the third insulation layer 23 and the conductive pillar 32 function as electric and mechanic interfaces that connect the rigid substrate and the flexible substrate. In other words, for a fine wiring layer with a finer L/S ratio, the structure of the flexible substrate is used. For a portion to which the flexible substrate is mounted, the structure of the rigid substrate is used. These interfaces are accomplished by the third insulation layer 23 and the conductive pillar 32.

The materials of the first insulation layer 11, the second insulation layer 12, and the third insulation layer 13 are selected and the interfaces thereof are controlled so that the bonding strength between the second insulation layer 22 and the third insulation layer 23 is larger than the bonding strength between the first insulation layer 11 and the second insulation layer 22.

In the hybrid wiring board shown in FIG. 1, the material of the first insulation layer 21 (rigid layer) is prepreg of bismaleimide type polyimide resin such as BT resin. The material of the second insulation layer 22 (flexible layer) is polyimide film. The material of the third insulation layer 23 that connects the first insulation layer 21 and the second insulation layer 22 is prepreg of epoxy denatured polyimide.

The glass transition temperature Tg of the first insulation layer 21 (rigid layer) is in the range around 170 to 180° C. (in DSC method). The coefficient of thermal expansion in the vertical direction of the first insulation layer 21 is in the range from around 13 to 15 ppm/° C. The coefficient of thermal expansion in the horizontal direction of the first insulation layer 21 is in the range from around 14 to 16 ppm/° C. The coefficient of thermal expansion in the direction of the thickness of the first insulation layer 21 is around 56 ppm/° C. (at α1), around 263 ppm/° C. (at α2), and around 120 ppm/° C. (in the range from 50 to 250° C.).

The coefficients of thermal expansion in the vertical and horizontal directions of the second insulation layer 22 (flexible layer) are in the range from around 20 to 22 ppm/° C. The coefficient of thermal expansion in the direction of the thickness of the third insulation layer 23 is around 25 ppm/° C.

The glass transition temperature Tg of the third insulation layer 23 is in the range from around 230 to 240° C. (in DMA method) and in the range from around 220 to 230° C. (in TMA method). The coefficients of thermal expansion in the vertical and horizontal directions of the third insulation layer 23 are in the range from around 13 to 15 ppm/° C. The coefficient of thermal expansion in the direction of the thickness of the third insulation layer 23 is around 57 ppm/° C. (at α1), around 159 ppm/° C. (at α2), and around 159 ppm/° C. (in the range from 50 to 250° C.).

With various materials such as prepreg of polyimide type BT resin BN300 (Mitsui Toatsu) and prepreg of PPE (polyphenylene ether) as the materials of the third insulation layer 23, the inventors of the present invention fabricated hybrid wiring boards in the structure shown in FIG. 1. As results, when the third insulation layer 23 (bonding layer) is made of bismaleimide type polyimide resin such as BT resin or PPE resin, the bonding strength with the first insulation layer 21 is sufficient. In contrast, when the third insulation layer 23 is made of polyimide type film or polyester type film, the bonding strength with the first insulation layer 21 is not sufficient.

In addition to the selection of the material, in the hybrid wiring board according to the first embodiment of the present invention, the connecting surface between the second insulation layer 22 (flexible layer) and the third insulation layer 23 (rigid layer) is controlled so that the bonding strength increases.

The connecting surface between the second insulation layer 22 and the third insulation layer 23 (the wiring layer is disposed on the connecting surface) has a surface layer so that the free energy on the front surface is larger than that of the rear surface (on which the wiring layer 13 is disposed). Thus, the wettability of the connecting surface is much improved (see FIGS. 7A and 7C). Consequently, the bonding strength of the second insulation layer 22 to the third insulation layer 23 can be improved.

As experimental results, when a solder re-flowing process is performed for mounting a semiconductor device, large thermal load does not cause the adhesion between the second insulation layer 22 and the third insulation layer 23 to deteriorate. Alternatively, the connecting surface of the second insulation layer 22 to the third insulation layer 23 may be reformed on sub-micron order or less.

The mat layer can be formed by alkali-washing or plasma-ashing polyimide film.

In addition to the front surface of the insulation layer, the front surface of the wiring layer may be reformed by for example black oxide treatment or CZ process so as to increase the unevenness of the front surface of the insulation layer.

In such a structure, the bonding strength between the rigid layer and the flexible layer of the hybrid wiring board according to the first embodiment of the present invention can be remarkably increased. Thus, since peel-off defect and selling defect of film are prevented, the reliability of the wiring board is improved.

(Second Embodiment)

In the hybrid wiring board shown in FIG. 1, the structure of which the rigid substrate made of the first insulation layer 21 (rigid layer) and the wiring layers 11 and 12 disposed on both the surfaces thereof and the flexible substrate made of the second insulation layer 22 (flexible layer) and the wiring layers 13 and 14 disposed on both the surfaces thereof are electrically and mechanically connected with the third insulation layer 23 and the conductive pillar 32 was exemplified. However, the present invention is not limited to such a structure. Instead, as the rigid substrate and the flexible substrate connected to the third insulation layer, substrates having three or more wiring layers may be used.

Figure 2:
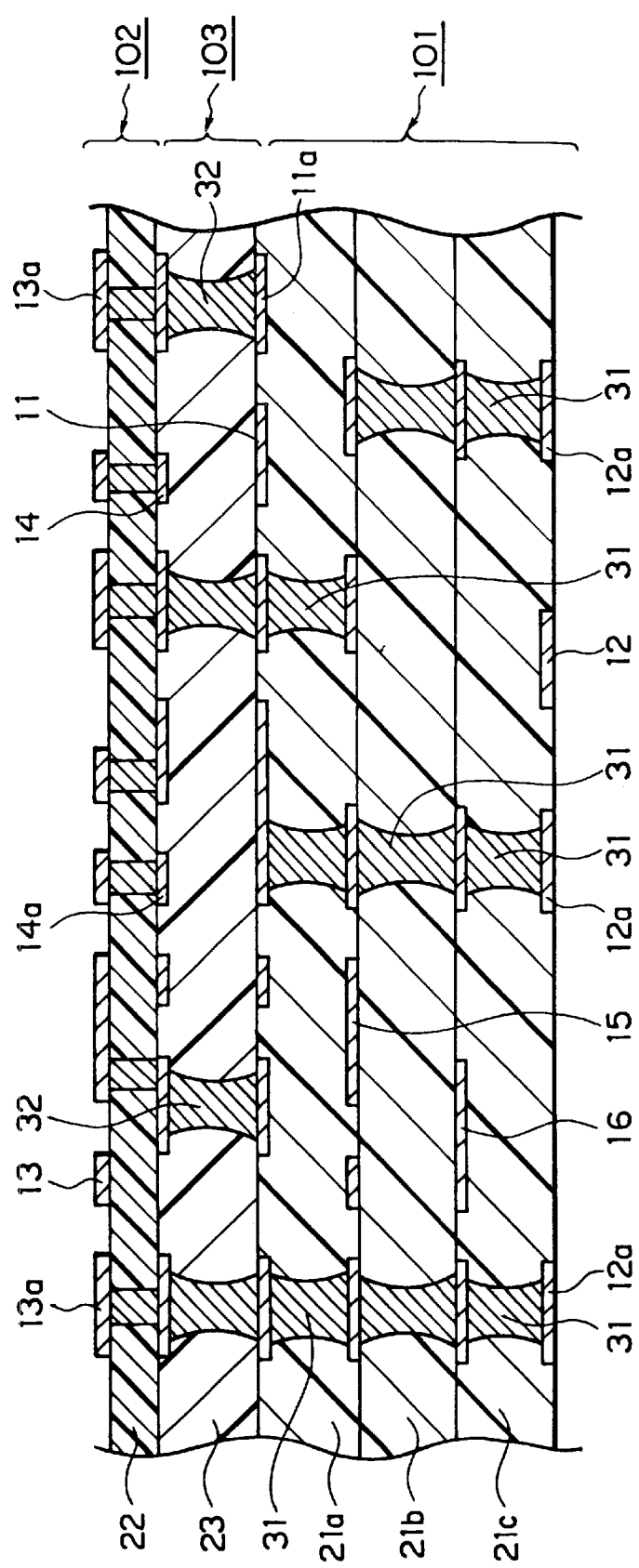
FIG. 2 is a sectional view showing the structure of a hybrid wiring board according to a second embodiment of the present invention.

FIG. 2 is a sectional view showing the structure of a hybrid wiring board according to a second embodiment of the present invention. In the hybrid wiring board shown in FIG. 2, a rigid substrate 101 is a laminate of four wiring layers 11, 12, 15, and 16 and three insulation layers 21a, 21b, and 21c. An interface portion 103 has a third insulation layer 23 and a conductive pillar 32. The rigid substrate 101 and the flexible substrate 102 are electrically and mechanically connected with the interface portion 103.

As described earlier, the connecting surface between the flexible substrate 102 and the interface portion 103 is formed so that the bonding strength thereof is improved. The connecting surface between the second insulation layer 22 and the third insulation layer 23 and the connecting surface between the wiring layer 14 and the third insulation layer 23 may be reformed so that fine uneven surfaces are formed. In this example, the connecting surface of the flexible substrate 102 has a surface phase with a higher wettability of which the contacting angle is 120° or more. Thus, the flexible substrate 102 and the rigid interface portion 103 can be securely bonded.

In this example, the wiring layers 11, 12, 15, and 16 that structure the rigid substrate 101 are connected with the conductive pillar 31. Alternatively, a layer connecting means such as a through-hole other than the conductive pillar may be used. With the conductive pillar, the layer connecting density can be increased. In addition, the yield can be improved. Thus, many conductive pillars are preferably used. In addition to the rigid substrate 101, the flexible substrate 102 may have many wiring layers.

(Third Embodiment)

FIG. 3 is a sectional view showing the structure of a semiconductor package according to a third embodiment of the present invention.

Figure 10:
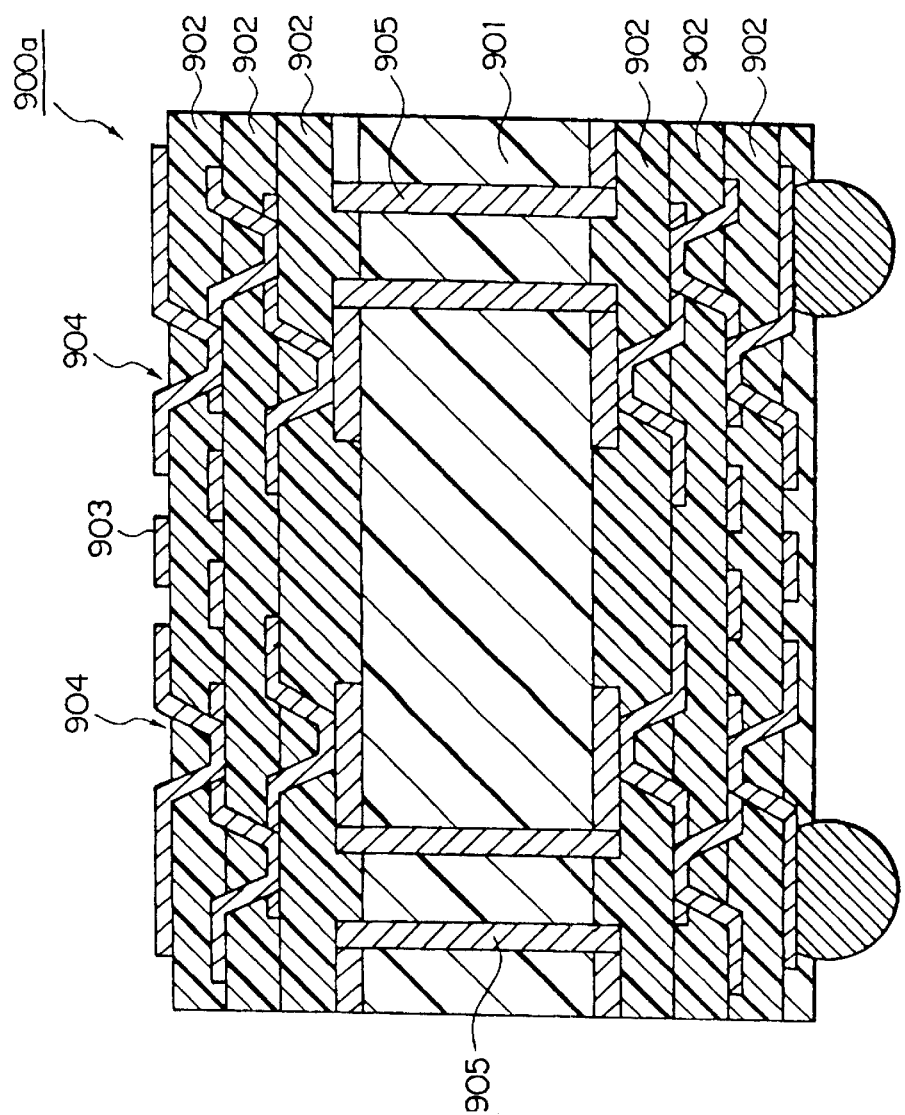
FIG. 10 is a sectional view showing the structure of a build-up board of a related art reference.
Figure 11:
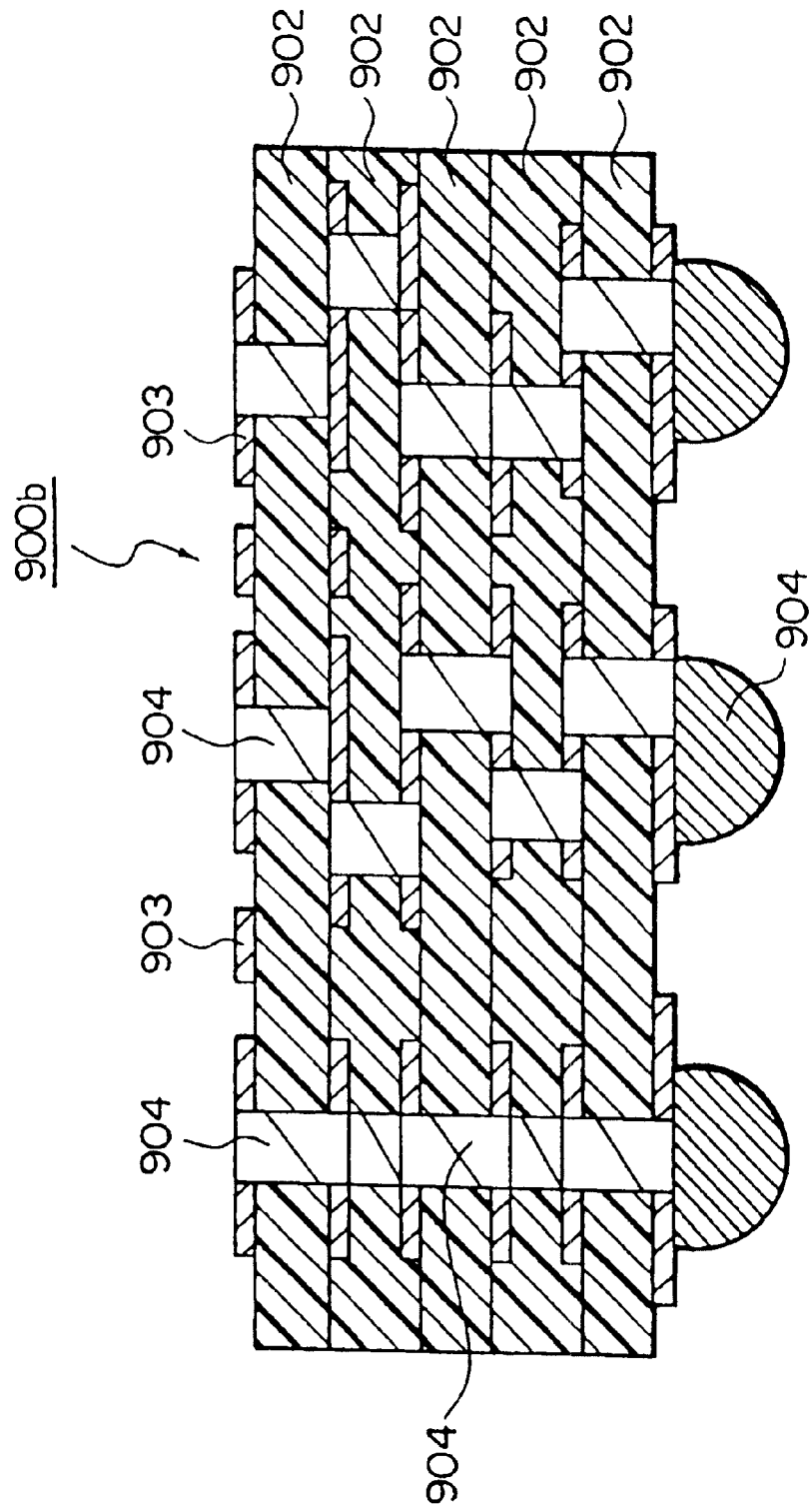
FIG. 11 is a sectional view showing the structure of a film laminate board of a related art reference.
Figure 12:
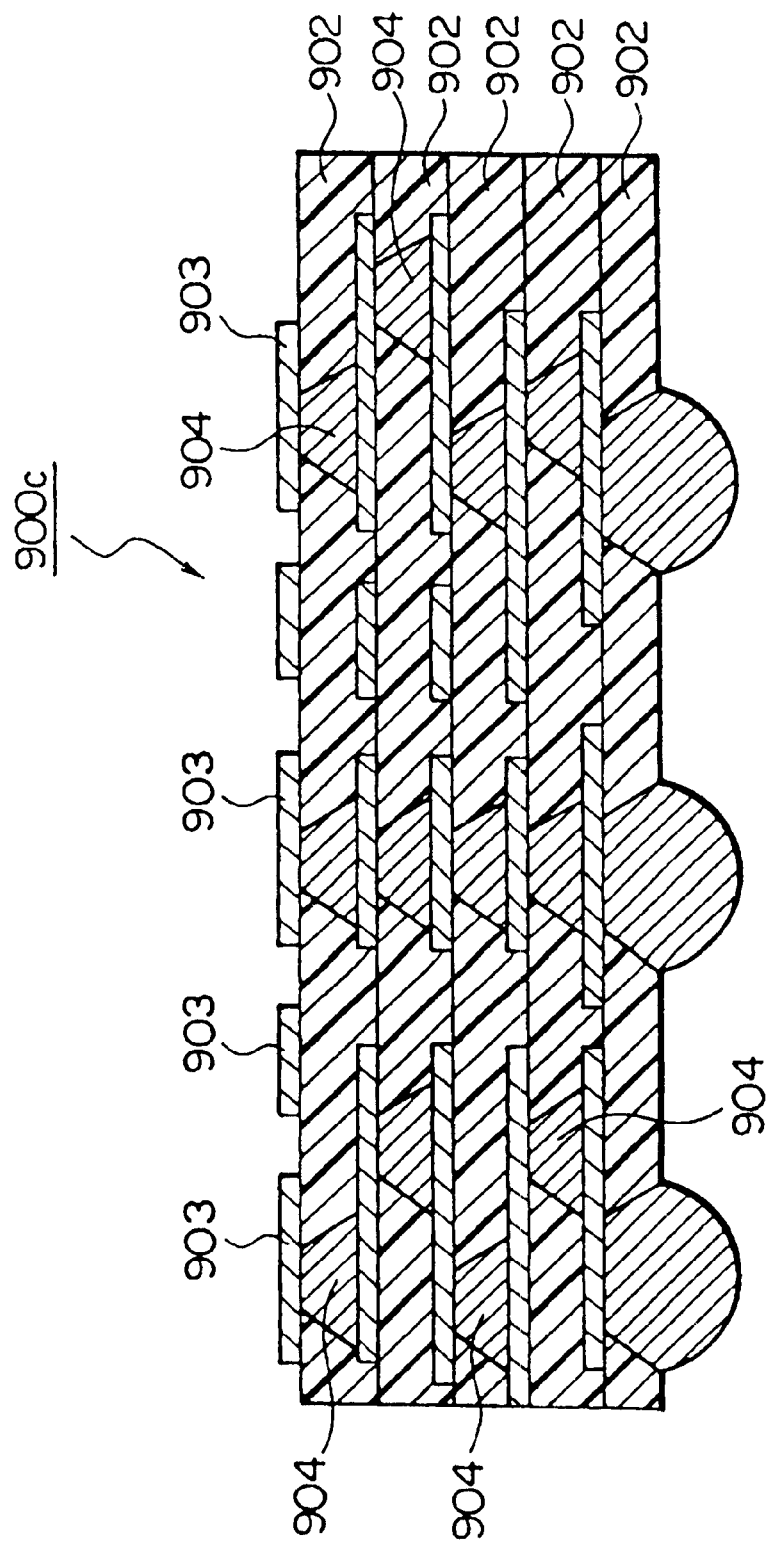
FIG. 12 is a sectional view showing the structure of a film laminate board of a related art reference.
Figure 13:
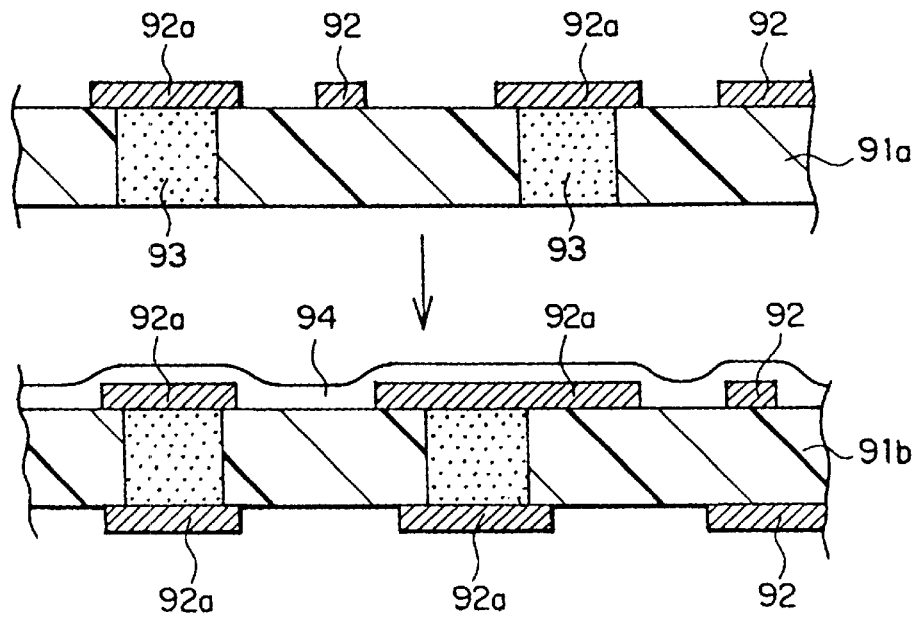
FIG. 13 is a sectional view for explaining a fabrication method of a conventional laminate flexible wiring substrate.
Figure 14:
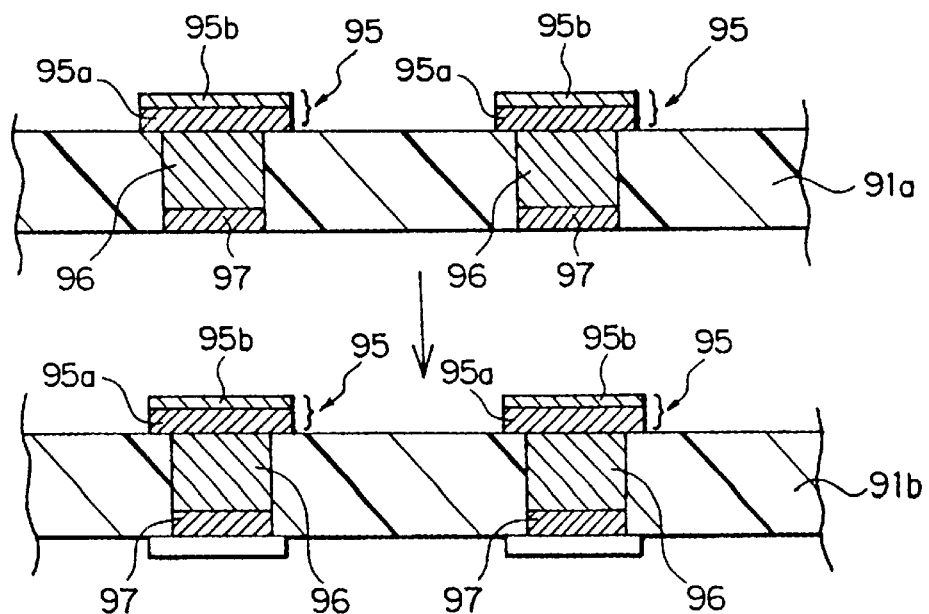
FIG. 14 is a sectional view for explaining a fabrication method of a conventional laminate flexible wiring substrate.

The semiconductor package shown in FIG. 3 is a BGA package of which a semiconductor device 41 is mounted on the hybrid wiring board 10 shown in FIG. 10 according to the present invention by flip-chip bonding method.

The semiconductor device 41 is a bare chip. The semiconductor device 41 has a connecting pad 42 connected to an integrated circuit disposed in the semiconductor device. In this example, 900 connecting pads 42 are disposed on the lower surface of the semiconductor device 41 at pitches of around 0.35 mm in a full grid pattern.

A wiring layer 13 disposed on a second insulation layer 22 (flexible layer) of the hybrid wiring board has a connecting pad 13b or a via land 13a corresponding to the connecting pad 42 of the semiconductor device 41.

The connecting pad 13b or the via land 13a is bonded to the connecting pad 42 of the semiconductor device 41 with a conductive bump 43 made of solder of for example Pb/Sn alloy by flip-chip bonding method.

On the other hand, solder balls 44 are disposed on a wiring layer 12 of a second surface of the hybrid wiring board in a grid array shape. With the solder ball 44, the semiconductor package is connected to an external circuit such as a mother board. In FIG. 3, reference numeral 45 is solder resist.

The wiring board that structures the semiconductor package is a hybrid wiring board according to the present invention as shown in FIGS. 1 and 2. The wiring board has a first insulation layer (rigid layer) 21, a second insulation layer (flexible layer) 22, and a third insulation layer 23 that connects the first insulation layer 21 and the second insulation layer 22. The third insulation layer 23 is more rigid than the second insulation layer 22. The mounting surface of the semiconductor device 41 is made of the second insulation layer (flexible layer) 22 and a wiring layer 13 disposed thereon. Thus, a fine pattern with an L/S ratio of 50/50 µm or less can be formed on the wiring layer 13. In this example, the wiring layers 13 and 14 of the second insulation layer 22 are formed with a very fine L/S ratio of 25/25 µm.

On the other hand, the wiring layer 12 disposed on the first insulation layer 21 is formed with a coarser L/S ratio of 50/50 µm so as to allow the wiring layer 12 to be easily connected to an external circuit.

The wiring layer having the fine pattern on the flexible layer and the wiring layer on the rigid layer are connected with a conductive pillar 32 disposed in the via lands 11 and 14 and pierced through the third insulation layer 23. The conductive pillar 23 lesser damages the glass cloth of the third insulation layer 23 than a through-hole. Thus, the layer connecting density can be improved and thereby the wiring layers having fine patterns can be connected. In addition, the reliability of the layer connections can be improved.

On the second surface of the first insulation layer 21, 900 solder balls are disposed at pitches of around 1.0 mm in the full grid pattern.

In the hybrid wiring board according to the present invention, with the conductive pillars 31 and 32, wiring patterns on the rigid layer and fine wiring patterns on the flexible layer can be connected. Thus, with the semiconductor package according to the third embodiment of the present invention, a highly integrated semiconductor device with connection pads 42 disposed at a high density can be mounted.

In the semiconductor package according to the third embodiment of the present invention, a wiring layer can be formed on the mounting surface of the semiconductor device in a finer pattern. In addition, when the third insulation layer 23 is made of a material with a low dielectric constant such as polyimide film, polyester film, or PTFE (polytetrafluoroethylene) film, since the wiring capacitance decreases, signals that flow in wires are suppressed from delaying and deforming. Thus, the semiconductor package according to the third embodiment of the present invention can be applied to a semiconductor device that operates at high speed.

In the semiconductor package according to the third embodiment of the present invention, in addition to a flexible layer that allows a highly integrated semiconductor device to be mounted, the flexible layer is securely connected to a rigid layer. Thus, the reliability against thermal load and mechanical load applied to a semiconductor package to be mounted on a mother board is improved.

In a film laminate substrate, an insulation layer made of polyimide has a relatively large coefficient of thermal expansion. Thus, when solder re-flowing process is performed or a thermal load is applied in the real use of a semiconductor package, solder balls tend to crack. On the other hand, in the semiconductor package according to the third embodiment of the present invention, the flexible layer and the rigid layer are securely bonded. Thus, such a defect does not take place in the case that a thermal load is applied.

In the semiconductor package according to the third embodiment of the present invention shown in FIG. 3, the wiring layers on the rigid layer are connected with the conductive pillar pierced through the insulation layer. In addition, the wiring layers on the flexible layer are connected with the via-hole formed by laser radiating process. Alternatively, the wiring layers may be connected with a through-hole or a via-hole formed by photo-etching process.

Figure 9:
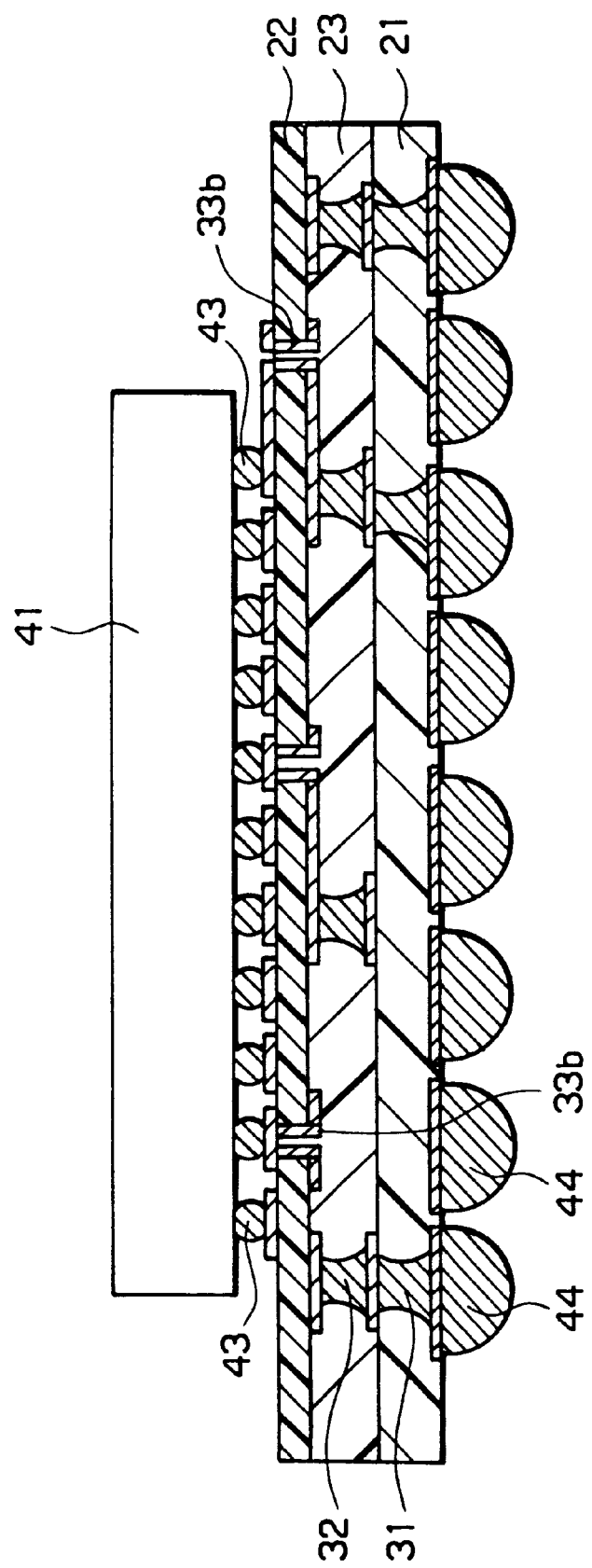
FIG. 9 is a sectional view showing the structure of a semiconductor package according to a modification of the third embodiment of the present invention.

FIG. 9 is a sectional view showing the structure of a semiconductor package according to a modification of the third embodiment of the present invention. In this structure, wiring layers disposed on a flexible layer are connected with a through-hole 33b.

In this example, a wiring layer 11 disposed on a first insulation layer 21 that is a rigid layer and a wiring layer 14 disposed on a second insulation layer 22 that is a flexible layer are connected with a conductive pillar 32.

(Fourth Embodiment)

Next, a fabrication method of a hybrid wiring board according to a fourth embodiment of the present invention will be described. FIGS. 4A, 4B, 4C, 4D, 4E, and 4F are sectional views for explaining a fabrication method of a hybrid wiring board according to the fourth embodiment of the present invention. In this example, the fabrication method of the hybrid wiring board shown in FIG. 1 will be described.

As a substrate of a rigid layer of which conductor foil is coated on both surfaces of a first insulation layer 21, double-sided copper laminated substrate was prepared. In this example, a double-sided copper laminated substrate of which electrolyte copper foil with a thickness of about 35 µm was coated on both the surfaces of the first insulation layer 21 of which a glass cloth with a thickness of about 1.2 mm was impregnated with bismaleimide type polyimide resin was prepared. In this example, as bismaleimide type polyimide resin, BT resin (Mitsubishi Gas Kagaku) was used. Alternatively, PPE, FR-4, high Tg FR-4, one of various bonding sheets, or thermoplastic film may be used instead of bismaleimide type polyimide resin. As will be described later, in the double-sided copper laminated substrate, layers were connected with a conductive pillar 31.

Figure 4A:
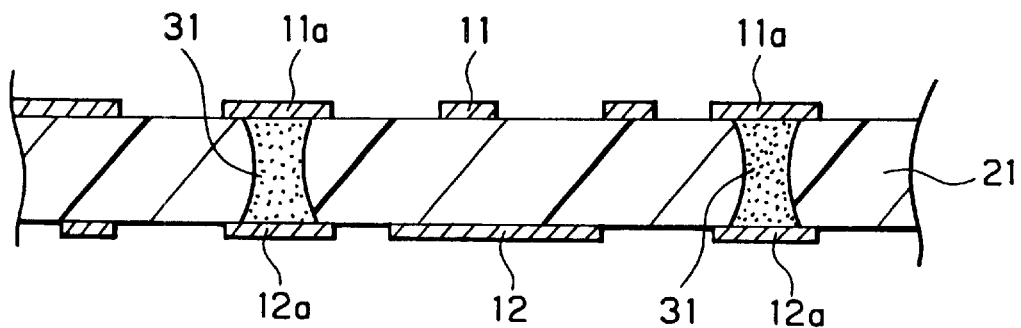
FIGS. 4A, 4B, 4C, 4D, 4E, and 4F are sectional views for explaining a fabrication method of a hybrid wiring board according to a forth embodiment of the present invention.

Thereafter, the copper foil coated on the first insulation layer 21 were patterned by for example photo-etching process (see FIG. 4A).

In this example, resist layer in predetermined patterns was formed on the copper foil by screen printing process. With masks of the resist, the copper foil was selectively etched out with an etching solution of ferric chloride. Thereafter, the resist was removed and wiring layers 11 and 12 with predetermined patterns were formed. In addition, via lands 11a and 12a were formed as parts of the circuit patterns of the wiring layers 11 and 12, respectively. The via lands 11a and 12a were formed in almost circular shapes whose diameters were around 0.4 mm. To alleviate a stress applied, a through-hole may be formed at the center of each via land.

Figure 4B:
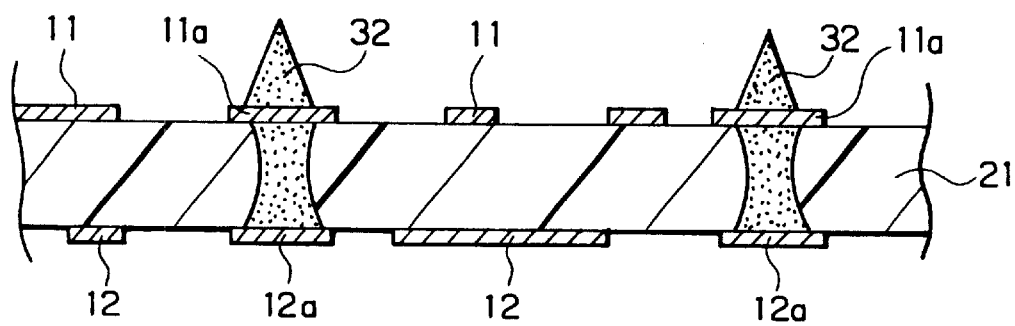

Next, a conductive pillar 32 in substantially a conical shape was formed on the via land 11a of the wiring layer 11 of the first insulation layer 21 (see FIG. 4B).

Figure 5:
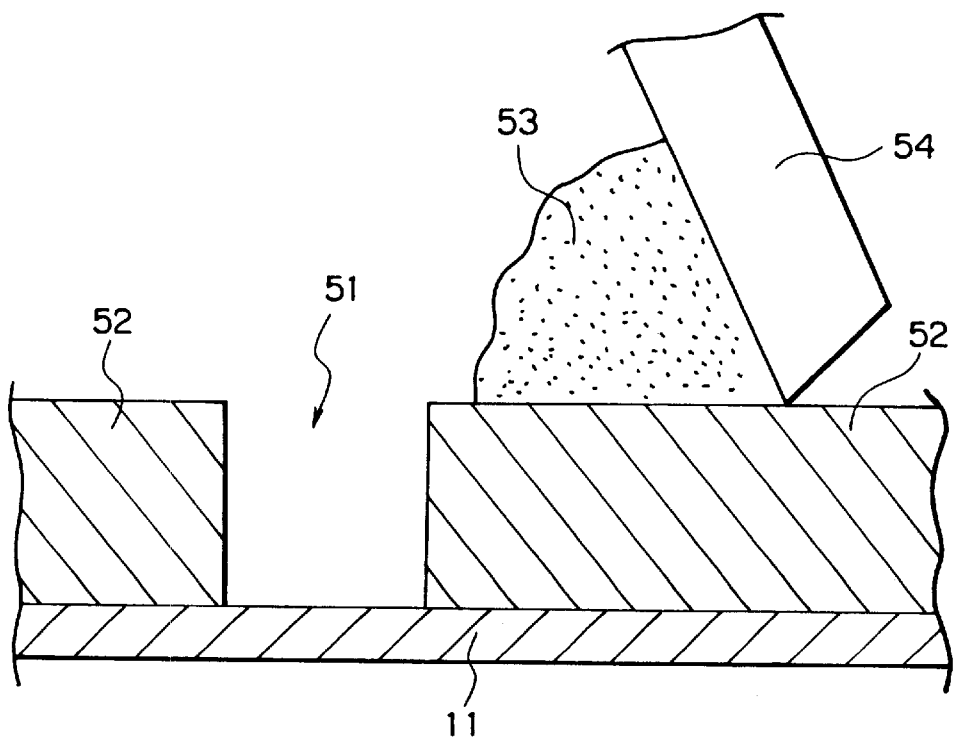
FIGS. 5 and 6 are sectional views for explaining a conductive pillar formed by screen printing process.
Figure 6:
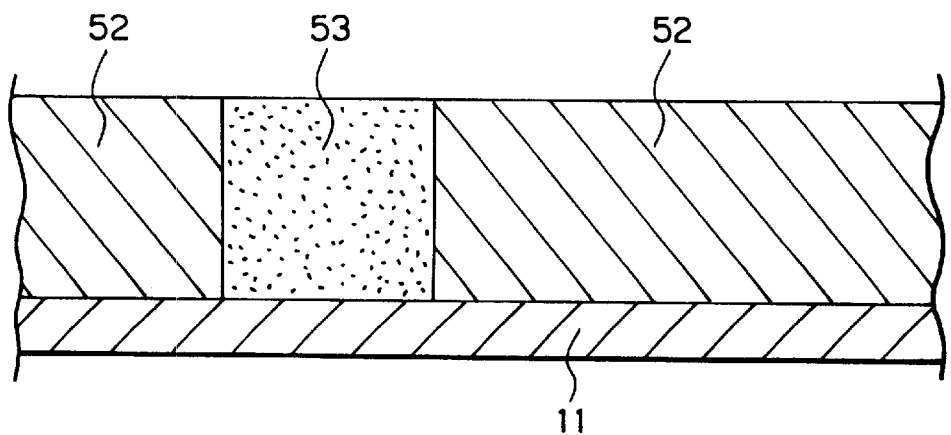

The conductive pillars 31 and 32 are formed by screen-printing conductive resin 53 through a metal mask 52 with a pit 51 corresponding to the via land 11a. FIGS. 5 and 6 are sectional views for explaining the screen printing process for forming the conductive pillar 32 with a squeegee 54.

The metal mask 52 was made of stainless steel. The thickness of the metal mask 52 was around 250 µm. In addition, the metal mask 52 had a hole 51 whose diameter was around 0.2 mm. In this example, the conductive resin 53 was made of conductive paste of phenol resin with filler of silver powder. Alternatively, conductive filler or binder resin may be used when necessary. After the printed conductive paste was dried, with the same mask, the printing process and the drying process were repeated three times at the same position. The resultant conductive resin was heated and thereby the conductive pillar 32 in substantially a conical shape was formed with a height of around 150 µm on the via land 11a.

The shapes of the conductive pillars 31 and 32 can be varied by adjusting the diameter and thickness of the pit of the mask, various properties (such as viscosity) of the conductive resin 53, and the number of times of the printing process.

Figure 4C:
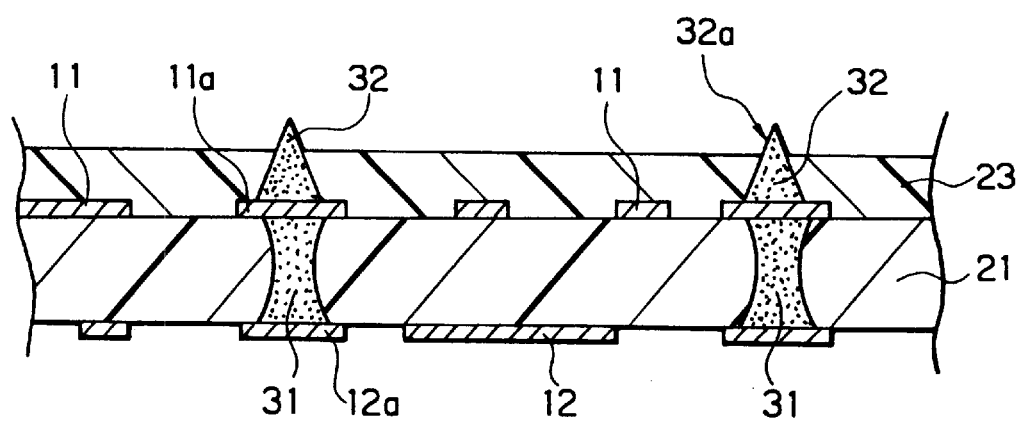

After the conductive pillar 32 was formed, the third insulation layer 23 was disposed on the wiring layer 11 so that the head portion of the conductive bump 32 was exposed (see FIG. 4C).

In this example, as the third insulation layer 23, epoxy denatured polyimide type resin sheet (MCL-I-671, Hitachi Garasu) with a thickness of around 30 µm in a semi-cure state (B state) was used. The piercing process is preferably performed in such a manner that the third insulation layer 23 in the semi-cure state is heated. In addition, to prevent the conductive bump 32 from being damaged, the first insulation layer 21 and the third insulation layer 23 were pressed through cushioning members that can be removed.

Figure 4D:
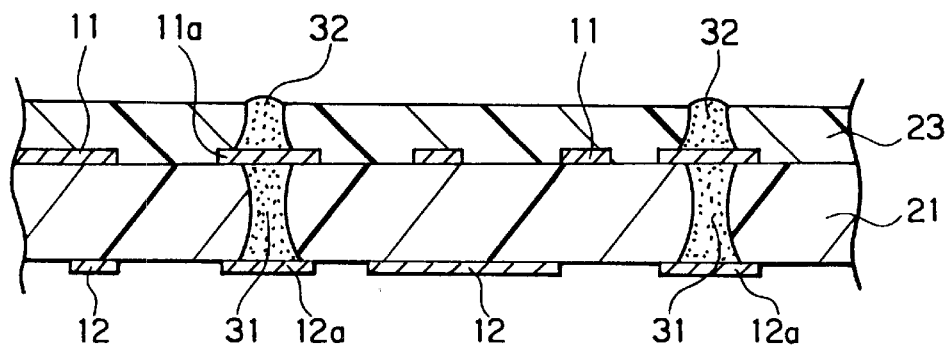

Next, the laminate of the first insulation layer 21 and the third insulation layer 23 was pressed with press plates so that a head portion 32a of the conductive bump 32 is plastic-deformed and crushed (see FIG. 4D). At the point, the laminate should be pressed in temperature and pressure conditions where the third insulation layer 23 does not harden, but in the semi-cure state. Thus, the conductive bump 32 was plastic-deformed so that the head portion 32a thereof was slightly exposed from the third insulation layer 23.

Figure 4E:
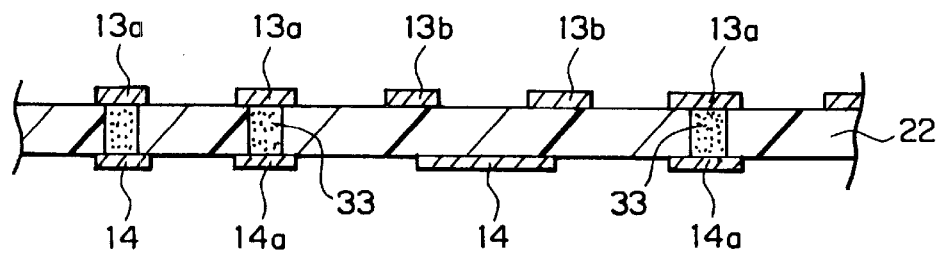

On the other hand, as a substrate of a flexible layer of which conductive foil layers were coated on both the surfaces of the second insulation layer 21, double-sided copper-clad polyimide film was prepared (see FIG. 4E).

In this example, double-sided copper-clad polyimide film of which electrolytic copper foil with a thickness of around 5 to 30 µm was coated on both surfaces of polyimide film with a thickness of around 25 to 50 µm was prepared. In this example, a layer connecting portion 33 that was a via-hole with a diameter of around 20 to 30 µm was formed in the double-sided copper-clad polyimide film by laser radiating process, photo-etching process, or the like. The copper foil as the wiring layers 13 and 14 was patterned in the above-described manner by for example photo-etching process. In this example, patterns with an L/S ratio of 30/30 µm were formed so as to allow a highly integrated semiconductor device to be mounted. The diameters of the via lands 13a and 14a were around 100 µm to 200 µm.

In this example, as the second insulation layer 22, polyimide film was used. Alternatively, other insulation resin film of for example polyester type or PTEF type may be used.

The second surface (on which the wiring layer 14 was disposed) of the second insulation layer 22 was reformed by alkali-washing process so as to improve the wettability of the second surface. In this example, the second surface of the second insulation layer 22 was washed with a solution of around 10 w % of NaOH for around 30 seconds.

In such a structure, the adhesion of the flexible substrate according to the fourth embodiment of the present invention to the prepreg of which a substrate such as a glass cloth was impregnated with BT resin, glass epoxy, epoxy denature polyimide, or the like can be improved.

Thereafter, the laminate of the first insulation layer 21 and the third insulation layer 23 and the second insulation layer 22 were disposed in such a manner that the via land 14a on the second surface of the second insulation layer 22 faced the via land 11a on the first surface of the first insulation layer 21. Thus, the via land 14a was disposed opposite to the plastic-deformed head portion of the conductive pillar on the via land 11a.

Figure 4F:
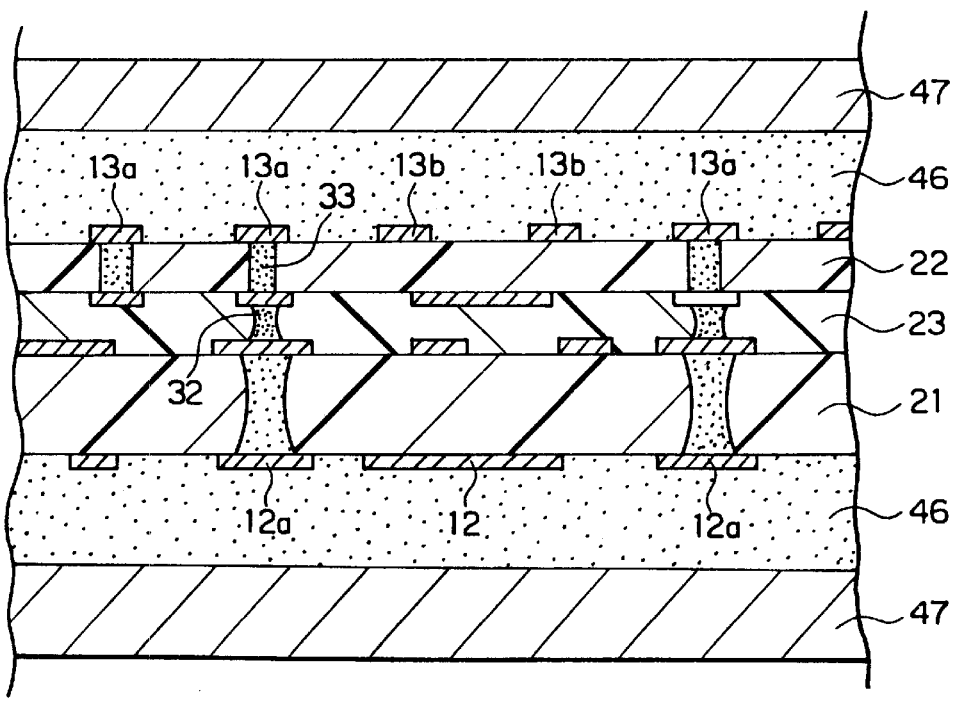

The wiring layer 12 and the wiring layer 13 of the laminate were pressed with press plates 47 through cushioning members 47 (see FIG. 4F). By heating and pressing the third insulation layer 23, it cured to C stage. At the point, the conductive pillar 32 in an almost conical shape disposed on the via land 11a was further plastic-deformed and connected to the opposite second via land 14a.

The cushioning members 46 used along with the press plates 47 are preferably metal plates that less deform (such as stainless plates or brass plates) or heat resistance resin plates that less deform (such as polyimide resin plates or polytetrafluoroethylene resin plates).

In the above-described process, a four-layered hybrid wiring board with many via lands connecting the wiring layers was accomplished.

Thereafter, a surface finishing process such as a solder resist process, a component masking process, or a gold plating/solder coating process may be performed when necessary.

The connecting resistance of the wiring circuit of the flexible portion of the hybrid wiring board according to the fourth embodiment of the present invention was 5 mΩ, whereas the connecting resistance of that of the rigid portion was around 10 mΩ. The connecting resistance is equivalent to the resistance of which all the conductive pillars are connected in series through the wires made of the copper foil. Considering the pattern resistance of the copper foil, the average connecting resistance per conductive pillar was around 1 mΩ.

In addition, the inductance of the conductive pillar was around 0.001 nH that is around 1/30 of the inductance of a conventional IVH (around 0.03 nH). The connecting resistance of the conductive pillar and the pattern resistance of the copper less fluctuated. In addition, since a stab was not used, signal delay and signal loss could be remarkably suppressed in high frequency region.

The hybrid wiring substrate was cut on a plane perpendicular to the axial direction of the conductive pillar and the layer connecting portion was observed. The observed result shows that the conductive pillars 32 and the via lands 11a and 14a are securely connected and bonded.

Stress applied to the via land with which substrates are bonded is alleviated with the conducive pillar that is plastic-deformed. Thus, the wiring circuit including the via land are suppressed from breaking and thereby the layers can be connected with high reliability. In addition, since layer connections using a through-hole can be minimized, the hybrid wiring board can be applied to a high density circuit.

Moreover, in the fabrication method according to the fourth embodiment of the present invention, while the high yield is kept with the conductive pillar, connecting defects of layer connections of a high density circuit can be suppressed.

In this example, layers are connected with the conductive pillar 32 formed on the via land 11a. Alternatively, the conductive pillar 32 may be formed on the via land 12a. In this case, the third insulation layer 23 in the semi-cure state may be disposed on the surface of the second insulation layer 22 on which the conductive pillar 32 is formed. In addition, the third insulation layer 23 may be deposited on both the via land 11a and the via land 12a. In this case, the bonding process of the conductive pillar 32 and the piercing process of the conductive pillar 32 to the third insulation layer may be performed at the same time.

(Fifth Embodiment)

Next, the reforming method of the bonding surface of a second insulation layer 22 and a third insulation layer 23 will be described.

In the hybrid wiring board according to the fourth embodiment of the present invention, the second surface of the second insulation layer 22 (the wring layer 14 is formed on the second surface) is reformed by alkali-washing process so as to improve the wettability of the surface layer 22a.

In other words, one surface of the second insulation layer 22 is washed with a solution of around 10 wt % of NaOH for around 30 seconds. Thus, the wettability of the relevant surface of the second insulation layer 22 is improved. It should be noted that the present invention is not limited to such a reforming method.

Figure 7A:
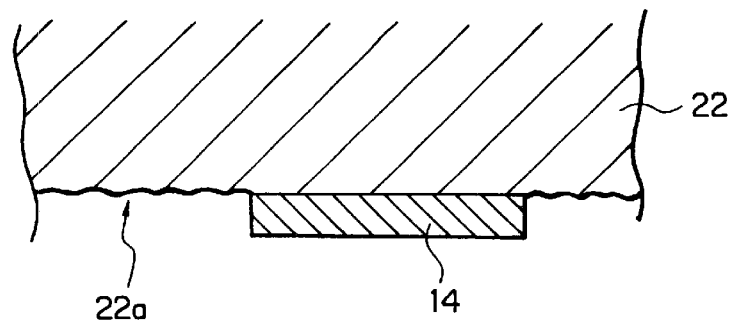
FIGS. 7A, 7B, and 7C are schematic diagrams for explaining the front surface of a second insulation layer that has been reformed according to a fifth embodiment of the present invention.
Figure 7B:
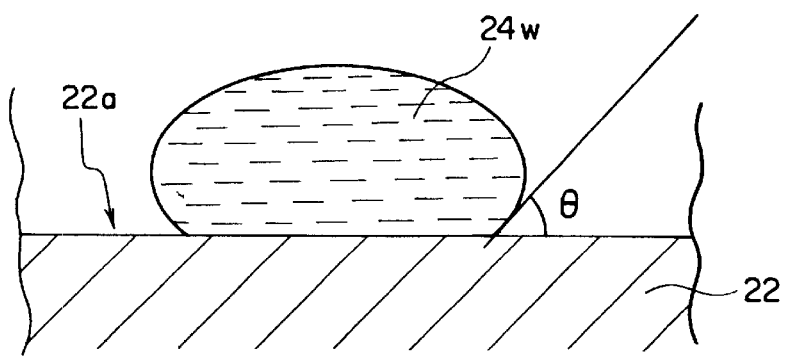
Figure 7C:
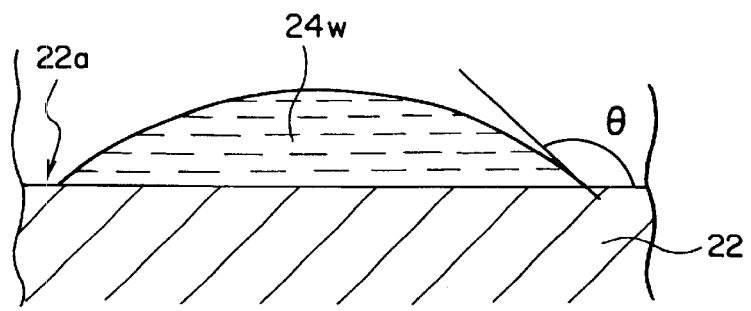

FIGS. 7A, 7B, and 7C are schematic diagrams for explaining a mat surface 22a of the second insulation layer. FIG. 7A is an enlarged view of the mat surface 22a. FIGS. 7B and 7C are schematic diagrams showing contacting angles of water drops to the front surface 22a of the second insulation layer 22 before and after the front surface 22a is reformed.

FIG. 7A shows an example of which the front surface 22a of the second insulation layer 22 is physically processed by for example blast-finishing process. In this case, the front surface 22a of the second insulation layer 22 is reformed in a fine uneven surface on the order of several microns to sub-microns observed by for example an SEM (Scanning Electron Microscope).

On the other hand, the unevenness of the mat layer formed on the front surface 22a by alkali-washing process or plasma-ashing process was very fine and could not be observed by the SEM. However, as will be described later, the wettability of the mat layer was remarkably improved. The free energy of the surface 22a was large. A trace amount of Ca ions were trapped on the front surface 22a that had been alkali-washed, according to a SEM-EDS measurement or EPMA measurement.

FIGS. 7B and 7C show that the wettability to water is improved by the reforming process. Before the reforming process was performed, the contacting angle θ of a water drop 24 w was smaller than 60° (see FIG. 7B). However, after the reforming process was performed, the contacting angle θ of a water drop 24 w was larger than 120° (see FIG. 7C). Thus, it is clear that the surface free energy of the surface layer increases.

With the second insulation layer 22 in the state shown in FIG. 7B, a hybrid wiring board was fabricated in the same method shown in FIGS. 4A to 4F. In the hybrid wiring substrate, a sufficient bonding strength between the second insulation layer 22 and the third insulation layer 23 was not obtained. A test result of a heat resisting test of which a thermal load is periodically applied shows that a peel-off defect and a swell defect take place on the connecting surface. On the other hand, a test result using the second insulation layer 22 in the state shown in FIG. 7C represents that such defects do not take place.

Employing a structure of the wiring board according to the fifth embodiment of the present invention, the adhesion of an insulation material such as BT resin, glass epoxy, or epoxy denatured polyimide and an insulation material such as prepreg of which a glass cloth is impregnated with such as BT resin, glass epoxy, or epoxy denature polyimide can be improved.

The reforming process of the second insulation layer 22 to the connecting surface of the third insulation layer 23 is not limited to alkali-washing process as a wet method. Alternatively, a plasma-ashing process or a corona discharging process as a dry method may be applied.

As an experiment performed by the inventors of the present invention, in a chamber that had an exhaust system and a pair of parallel electrodes, a second surface of a second insulation layer 22 having wiring layers 13 and 14 on one side of the electrodes was disposed so that the second surface was exposed. The chamber was de-aerated and a high frequency wave was applied so that plasmas were generated between the electrodes.

The wettability of the front surface of the second insulation layer 22 was remarkably improved with the plasmas. The contacting angle θ of a water drop was larger than 120°. The experimental result shows that the fabrication method according to the fifth embodiment is effective in the case that PTFE (polytetrafluoroethylene) type insulation resin film is used as the second insulation layer 23.

(Sixth Embodiment)

Figure 8:
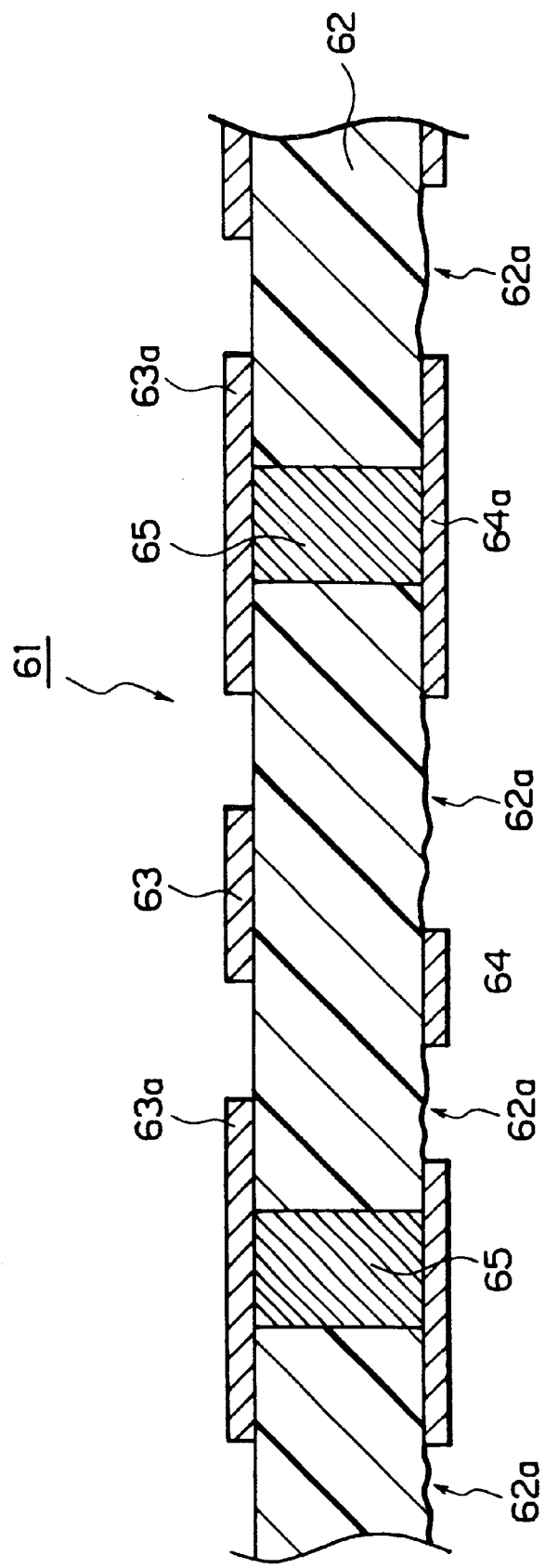
FIG. 8 is a sectional view showing the structure of a flexible substrate according to a sixth embodiment of the present invention.

FIG. 8 is a sectional view showing the structure of a flexible substrate according to a sixth embodiment of the present invention.

Referring to FIG. 8, a flexible substrate 61 has an insulation layer 62 and wiring layers 63 and 64. The insulation layer 62 is made of polyimide type resin film, polyester type resin film, or PTFE (polytetrafluoro-ethylene) type resin film. The wiring layers 63 and 64 are disposed on both the surfaces of the insulation layer 62. At least one surface of the insulation layer 62 has a mat layer 62a that has a contacting angle θ of around 120° or more to a water drop (see FIGS. 7A and 7C).

The wiring layer 63 and the wiring layer 64 are connected with via lands 63a and 64a and a via-hole 65 that is filled with conductive paste. The via-hole 65 is formed by laser radiating process. Alternatively, the wiring layer 63 and the wiring layer 64 may be connected with a through-hole. In addition, the via-hole may be formed by photo-etching process.

The mat layer 62a can be formed by the above-described alkali process or plasma-ashing process. In this example, one surface of the insulation layer 62 is washed with a solution of around 10 wt % of NaOH for around 30 seconds so as to improve the wettability of the surface 62a.

When the flexible substrate with the mat layer is laminated with another flexible insulation layer or a rigid insulation layer made of such as BT resin, glass epoxy, or epoxy denatured polyimide, the bonding strength can be improved. Thus, when flexible substrates are laminated or a flexible substrate and a rigid substrate are laminated, a sufficient bonding strength is obtained in the resultant hybrid wiring board. Thus, a wiring board that has high reliability (a high resistance to thermal load and mechanical load) can be accomplished.

(Seventh Embodiment)

Figure 15:
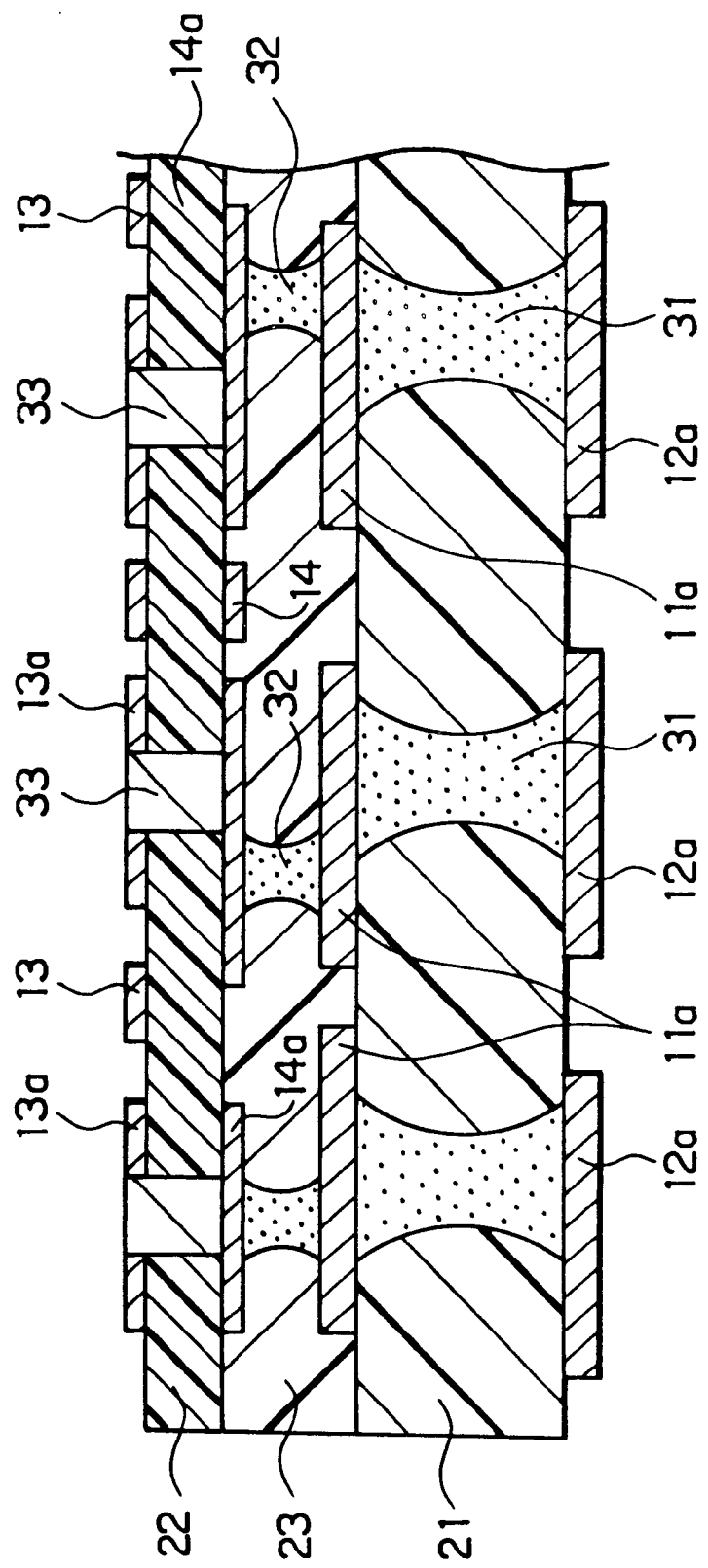
FIG. 15 is a sectional view showing the structure of a hybrid wiring board according to a seventh embodiment of the present invention.

FIG. 15 is a sectional view showing the structure of a hybrid wiring board according to a seventh embodiment of the present invention.

Referring to FIG. 5, a hybrid wiring board 10 according to the seventh embodiment is a laminate wiring board that has four wring layers 11, 12, 13, and 14. The wiring layer 11 and the wiring layer 12 are insulated with a first insulation layer 21 that is a rigid layer. The wiring layer 13 and the wiring layer 14 are insulated with a second insulation layer 22 that is a flexible layer. The wiring layer 11 and the wiring layer 14 are insulated with a third insulation layer 23 that is more rigid than the second insulation layer 22.

The wiring layers 11, 12, 13, and 14 have land portions 11a, 12a, 13a, and 14a as parts of respective wiring patterns.

The wiring layers 11, 12, 13, and 14 are formed by patterning conductive metal foil such as copper foil.

The first insulation layer 21 is made of prepreg of which a glass cloth is impregnated with BT resin. The second insulation layer 22 is made of polyimide film. The third insulation layer 23 is made of prepreg of which a glass cloth is impregnated with epoxy denatured polyimide. In other words, the first insulation layer 21 and the third insulation layer 23 are structured as rigid layers. On the other hand, the second insulation layer 22 is structured as a flexible layer.

Thus, in the hybrid wiring substrate according to the seventh embodiment of the present invention, the wiring layers 11 and 12 disposed on both the surfaces of the first insulation layer 21 (rigid layer) and the wiring layers 13 and 14 disposed on both the surfaces of the second insulation layer 22 (flexible layer) are electrically and mechanically connected with the third insulation layer 23 and a conductive pillar 32 that connects a first via land 11a and a second via land 14a. In other words, the third insulation layer 23 and the conductive pillar 32 function as interface means that connect the rigid portion and the flexible portion. For a wiring layer with a fine L/S ratio, the structure of the flexible substrate is used. For a portion to which the flexible substrate is mounted, the structure of the rigid substrate is used. These interface means are structured with the third insulation layer and the conductive pillar 32 that connect the layers.

In the hybrid wiring board according to the seventh embodiment of the present invention, the interface between the rigid substrate and the flexible substrate structured with the first via land 11a (that protrudes from the first insulation layer 21 to the third insulation layer 23), the second via land 14a (that protrudes from the second insulation layer 22 to the third insulation layer 23), and the conductive pillar 32 (that connects the first via land 11a and the second via land 14a). When the first via land 11a and the second via land 14a protrude to the third insulation layer 23, the height of the conductive pillar 32 can be decreased.

Thus, the diameter of the conductive pillar 32, whose outer peripheral surface is formed in one-sheet hyperboloid shape for example, can be decreased and thereby the wiring density can be improved.

Such a conductive pillar is formed by repeatedly screen-printing a relevant material on the via land. To form a conductive pillar 32 with a large height/diameter ratio, the number of times of printing process should be increased. On the other hand, in the wiring board according to the seventh embodiment of the present invention, since the height of the conductive pillar 32 is further decreased, the number of times of the printing process can be decreased and thereby the yield can be remarkably improved.

(Eighth Embodiment)

Figure 16:
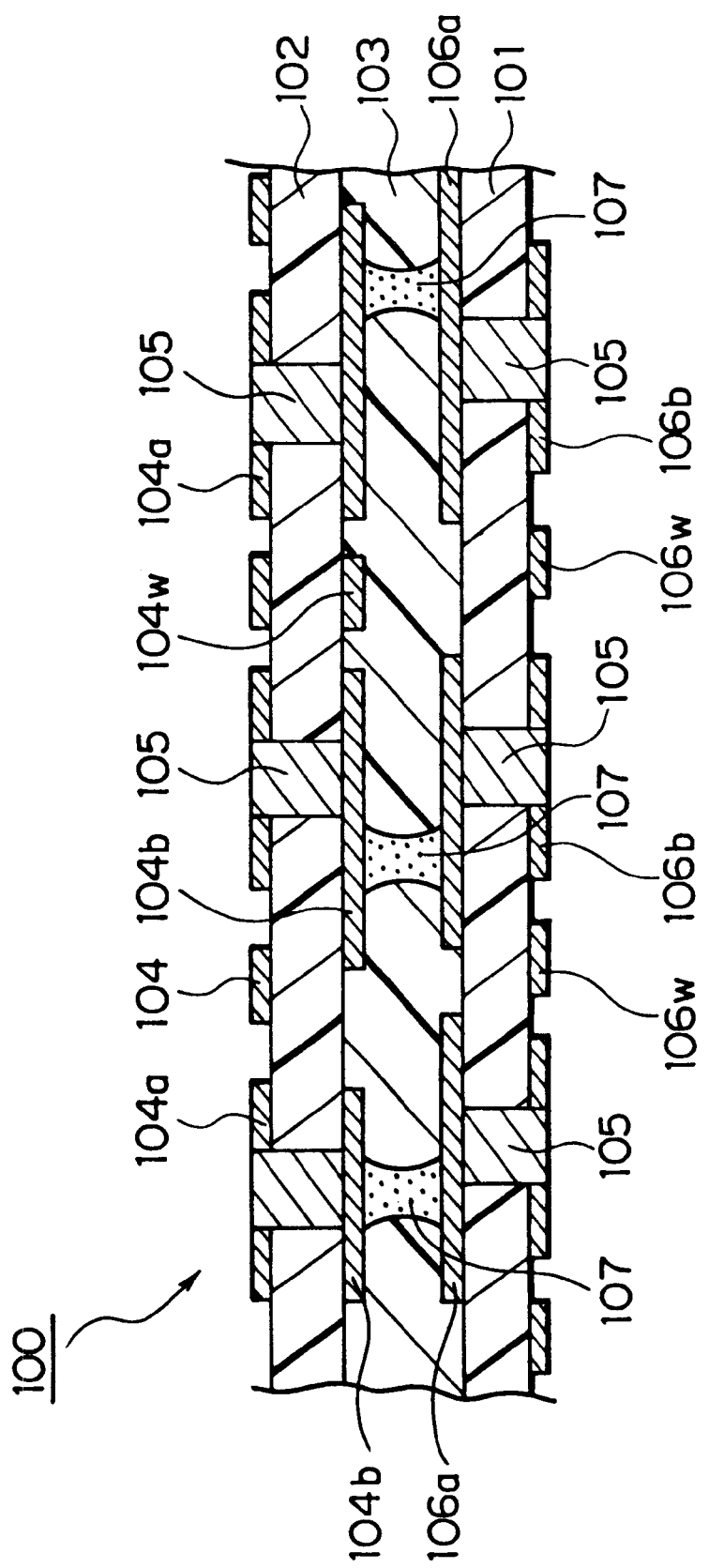
FIG. 16 is a sectional view showing the structure of a hybrid wiring board according to an eighth embodiment of the present invention.

FIG. 16 is a sectional view showing the structure of a hybrid wiring board according to an eighth embodiment of the present invention.

In this embodiment, a hybrid wiring board of which a plurality of flexible wiring substrates are laminated with an insulation resin layer and a conductive pillar will be described.

Referring to FIG. 16, in a hybrid wiring board 100, two flexible substrates made of a flexible insulation material such as polyimide film as insulation layers 101 and 102 are electrically and mechanically connected with an insulation resin layer 103 (such as the above-described third insulation layer) and a conductive pillar 107.

A wiring layer 106 including a first via land 106a is disposed on a first surface of the insulation layer 101. A wiring layer 106w including a second via land 106b is disposed on a second surface of the insulation layer 101.

A wiring layer 104 including a first via land 104a is disposed on a first surface of the insulation layer 102. A wiring layer 104w including a second via land 104b is disposed on a second surface of the insulation layer 102.

A hole is formed between the first via land 106a of the insulation layer 101 and the second via land 106. A hole is formed between the first via land 104a of the insulation layer 102 and the second via land 104b. These holes are formed by laser radiating process or photo-etching process. These holes are filled with a conductive substance 105 by screen printing process or plating process.

The two flexible substrates are electrically and mechanically connected with the insulation resin layer 103 and the conductive pillar 107. On the other hand, in the hybrid wiring board according to the eighth embodiment of the present invention, the first via land 106a disposed on the first surface of the insulation layer 101 protrudes to the insulation resin layer 103. In addition, the via land 104*b* disposed on the second surface of the insulation layer 102 protrudes to the insulation resin layer 103.

In such a structure, the height of the conductive pillar 107 can be decreased in comparison with the structure of which one of the first via land 106*a* and the second via land 104*b* does not protrude to the insulation resin layer 103.

Thus, the diameter of the conductive pillar 107 can be decreased. When the diameter of the conductive pillar 107 is not varied, the connecting reliability can be more improved.

Since the diameter of the conductive pillar 107 can be decreased, it can be densely disposed. Thus, a wiring board with a fine L/S ratio can be accomplished. In the structure of which flexible substrates are connected with an insulation resin layer and a conductive pillar, layers can be easily laminated without a tradeoff of the feature of the flexible substrate with a fine L/S ratio. In addition, since an insulation material with a low dielectric constant (such as polyimide and Teflon) can be used as the insulation layers 101 and 102, the present invention can be applied to a wiring board that mounts a semiconductor device with connection terminals disposed at a high density and operates at high speed.

Since the height of the conductive pillar 107 can be decreased, the number of times of the screen-printing process for forming the conductive pillar 107 can be decreased. Thus, the yield of the wiring board with the conductive pillar 107 that connects layers can be improved.

In this example, a laminate of a rigid substrate and a flexible substrate and a laminate of a flexible substrate and a flexible substrate were described. However, in the wiring board according to the eighth embodiment of the present invention, the type (rigid or flexible) of the substrates connected with the insulation resin layer and the conductive pillar is not limited. In other words, the present invention can be applied to a laminate of rigid substrates (a resin substrate and a ceramics substrate).

(Ninth Embodiment)

Figure 17:
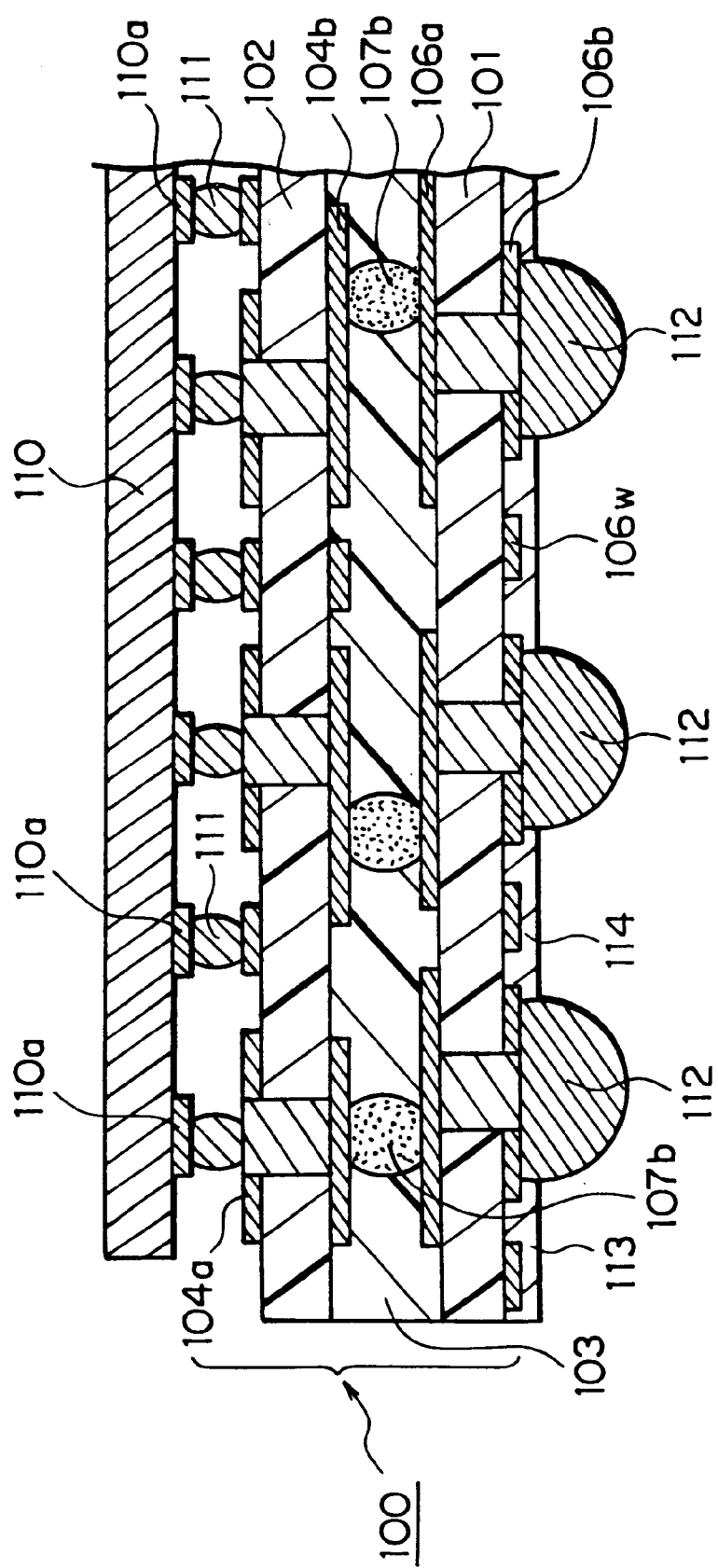
FIG. 17 is a schematic diagram showing the structure of a semiconductor apparatus according to a ninth embodiment of the present invention.

FIG. 17 is a sectional view showing the structure of a semiconductor apparatus according to a ninth embodiment of the present invention. In the semiconductor apparatus shown in FIG. 17, a semiconductor device 110 is mounted on a hybrid wiring board 100 shown in FIG. 16 with a conductive bump 111 by flip-chip bonding method.

A via land 104*a* disposed on a first surface of an insulation layer 102 and a connection terminal 110*a* disposed on the semiconductor device 110 are connected with a conductive bump 111 made of solder, gold, or the like.

In the hybrid wiring board according to the ninth embodiment of the present invention, since the diameter of a conductive pillar 107 can be decreased, it can be densely disposed. Thus, a wiring board with a high L/S ratio corresponding to a highly integrated semiconductor device can be accomplished. In addition, since an insulation material with a low dielectric constant (such as polyimide or Teflon) can be used as insulation layers 101 and 102, the semiconductor apparatus according to the ninth embodiment of the present invention can be applied to a wiring board that mounts a semiconductor device with connection terminals disposed at a high density and that operates at high speed.

In this example shown in FIG. 17, conductive pillars 107*b* are formed in a ball shape having a convex side surface. However, it is possible to form those conductive pillars 107*b* as same as conductive pillars 31, 32 shown in FIG. 1. Also, conductive pillars shown through FIG. 1 through FIG. 16 can be formed in the ball shape. Likewise in the invention, a shape of conductive pillar is not restricted as described, and it can be variably changed according to an electrical or a mechanical necessities. In addition, an area of an upper surface of the pillar and an area of bottom surface of the pillar can be different.

(Tenth Embodiment)

Figure 18A:
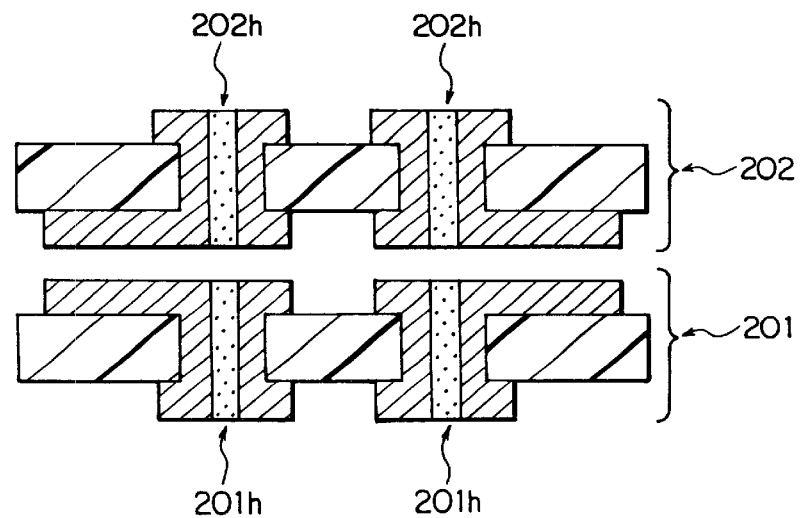
FIGS. 18A, 18B, and 18C are sectional views for explaining a fabrication method of a hybrid wiring board according to a tenth embodiment of the present invention.
Figure 18B:
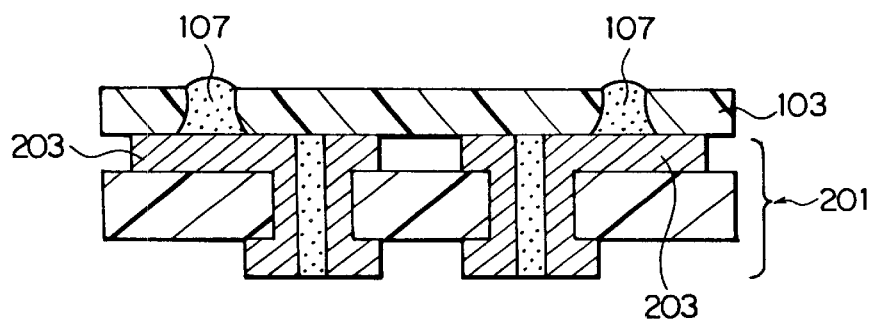
Figure 18C:
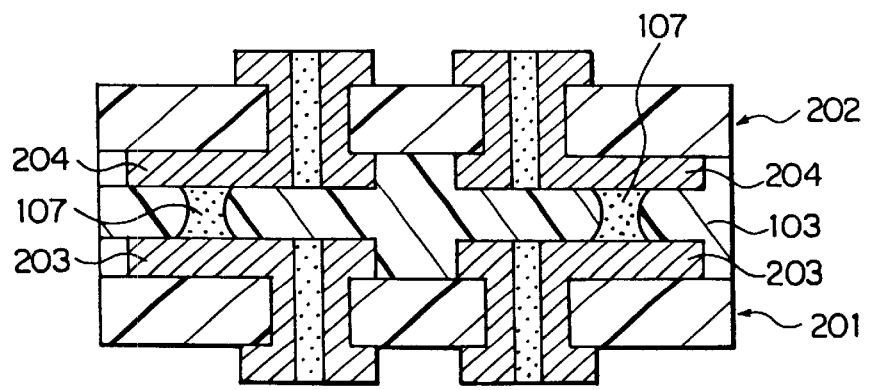

FIGS. 18A, 18B, and 18C are sectional views showing a fabrication method of a hybrid wiring board according to a tenth embodiment of the present invention.

In this example, a structure of which two rigid wiring substrates connected with a PTH (Plated Through-Hole) are laminated with an insulation resin layer and a conductive pillar will be described.

PTHs 201*h* and 202*h* are formed in wiring substrates 201 and 202 that are double-sided copper-clad plates by a conventional drilling/plating method. Circuit patterns are formed on surfaces of the wiring substrates 201 and 202 (see FIG. 18A).

At the point, the through-holes 201*h* and 202*h* may be filled with a conductive substance. In addition, the through-holes 201*h* and 202*h* may be filled with an insulation resin. Moreover, the through-holes 201*h* and 202*h* may be kept blank. However, when a conductive pillar 107 is disposed on the PTH 201*h* or 202*h*, it is preferably filled with such a substance.

In this example, the wiring substrates 201 and 202 are described as double-sided copper-clad plates. Alternatively, the wiring substrates 201 and 202 may be laminates (having three or more layers). In addition, the wiring substrates 201 and 202 may be flexible substrates. Moreover, circuit patterns may have been formed on both surfaces of the wiring substrates 201 and 202. Alternatively, circuit patterns may have been formed on inner surfaces of the wiring substrates 201 and 202.

Thereafter, the wiring patterns of the wiring substrates 201 and 202 are surface-finished by black oxide treatment, CZ process using CZ solution (Mech Company, LTD), alkali process, oxide washing process, or a combination thereof.

Next, a conductive pillar 107 in an almost conical shape is disposed on a via land 203 that is a part of a particular wiring pattern of the wiring substrate 201 by screen-printing process or the like.

A prepreg 103 that is melting is coated on the entire surface of the conductive pillar 107 and then the conductive pillar 107 is pierced through the prepreg 103.

Examples of the material of the prepreg 103 is FR-4, high Tg FR-4, BT resin, PPE, or each of various bonding sheets, and thermoplastic film. In particular, to obtain a sufficient bonding strength for both a flexible substrate and a conventional resin substrate, epoxy denatured polyimide is preferably used.

In addition, the head portion of the conductive pillar 107 exposed from the prepreg 103 is pressed in the axial direction of the conductive pillar 107 and thereby plastic-deformed (see FIG. 18B).

Thereafter, the wiring substrate 201 is aligned with the wiring substrate 202 and then laminated by pressing/heating process. When circuit patterns have been formed on both the surfaces of the wiring substrates, so-called cushioning members are preferably disposed between press plates so as to protect the circuits patterns on the outer layers.

By the heating/pressing process, the conductive pillar 107 is further plastic-deformed and thereby electrically connected to the via land 204. The prepreg 103 in the semi-cure state is hardened in rigid C stage (see FIG. 18C).

When circuits are not formed on outer layers, circuit patterns are formed in the conventional method.

When necessary, after solder-resist process, component marking process, and conductor surface finishing process (gold plating process or solder coating process), the hybrid wiring board according to the tenth embodiment of the present invention is accomplished.

In the above-described example, a laminate of two wiring substrates was explained. Alternatively, three or more wiring substrates may be laminated with the insulation resin layer 103 and the conductive pillar 107.

In the above-described structure, when the thickness between the two wiring substrates 201 and 202 (the thickest portion of the insulation layer 103) is in the range from around 50 to 80 $\mu$m and the thickness of the conductor layer including the via lands 203 and 204 is around 10 $\mu$m, the distance between the via lands 203 and 204 become around 30 to 60 $\mu$m.

At this point, the final height of the conductive pillar 107 becomes in the range from around 30 to 60 $\mu$m. Thus, the height of the conductive pillar 107 is smaller than that of the conventional structure. In this case, the diameter of the conductive pillar 107 becomes in the range from around 100 $\mu$m to 300 $\mu$m. Thus, the hybrid wiring board according to the tenth embodiment of the present invention can be applied to a high density circuit.

(Eleventh Embodiment)

Figure 19A:
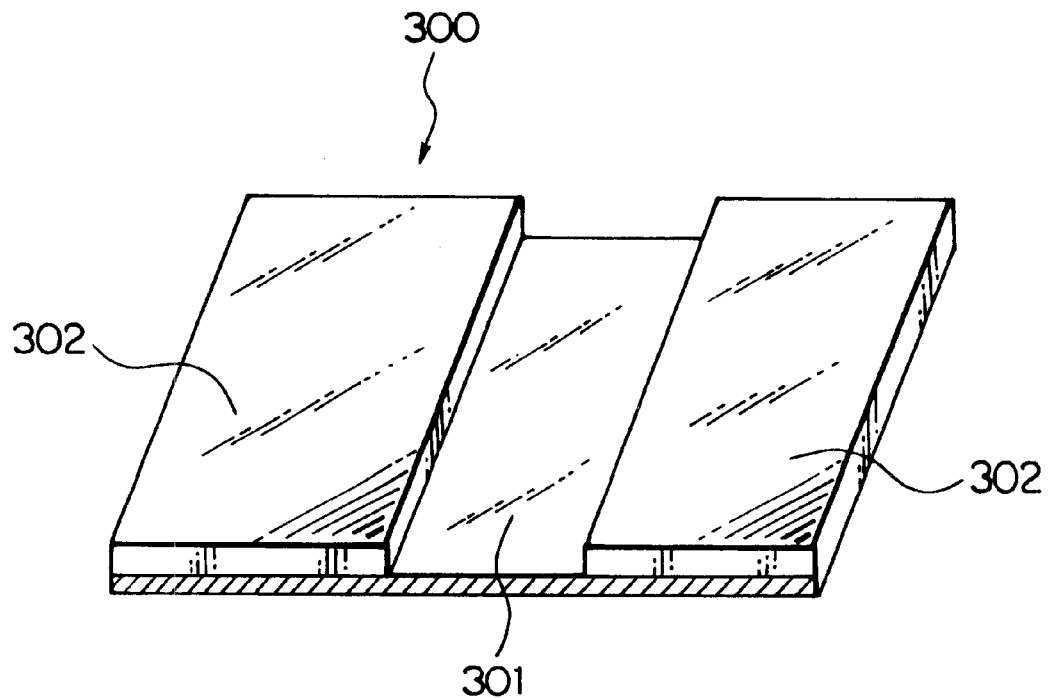
FIG. 19A is a perspective view showing the structure of a hybrid wiring board according to an eleventh embodiment of the present invention.
Figure 19B:
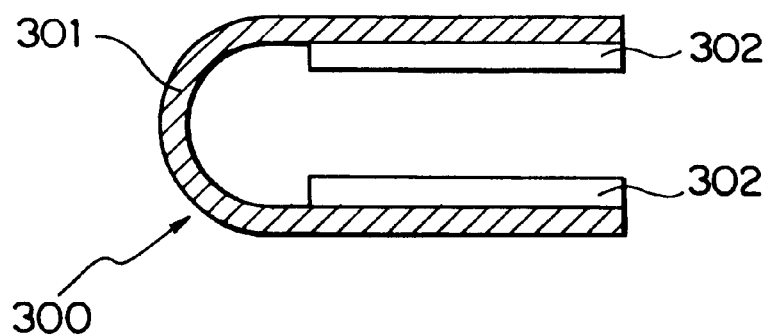
FIG. 19B is a view showing the structure of a hybrid wiring board according to an eleventh embodiment of the present invention.
Figure 20:
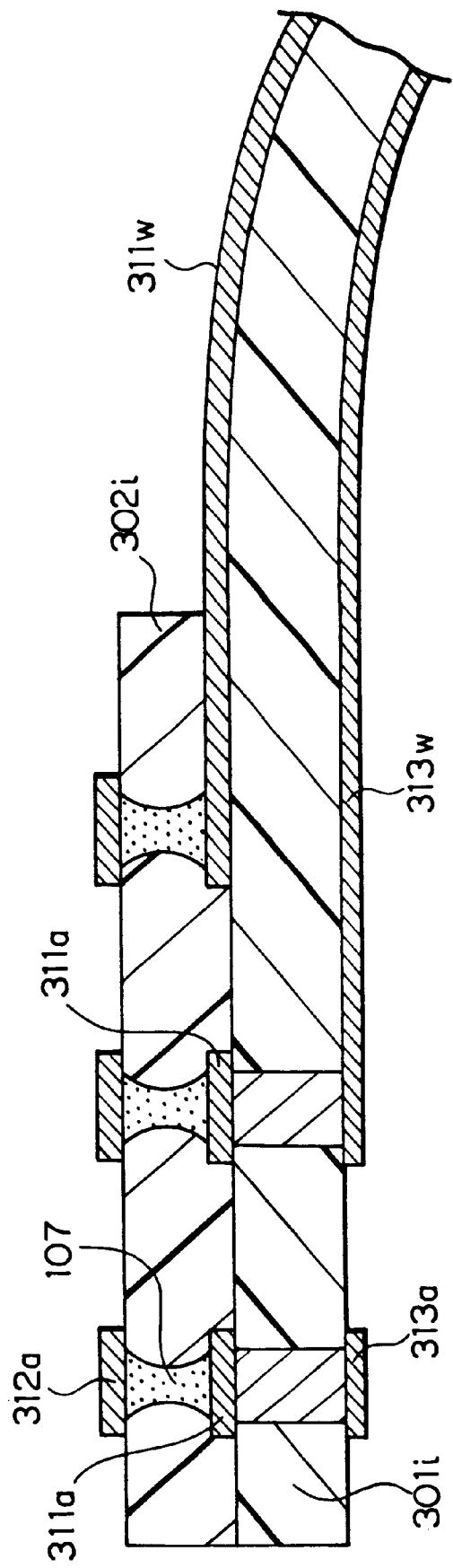
FIG. 20 is a sectional view showing the structure of the hybrid wiring board according to the eleventh embodiment of the present invention.

FIG. 19A, FIG. 19B and FIG. 20 are a perspective view and sectional views showing the structure of a hybrid wiring board according to an eleventh embodiment of the present invention, respectively.

Referring to FIG. 19A, FIG. 19B and FIG. 20, in a hybrid wiring board 300, a rigid layer 302 is integrally disposed at an area (first area) of a flexible wiring substrate 301.

The flexible wiring substrate 301 and the rigid layer 302 are electrically and mechanically connected with an insulation resin layer 302i (such as prepreg that hardens) and a conductive pillar 107.

In other words, a via land 311a disposed on a first surface of the flexible insulation layer 301i and a via land 312a disposed on the rigid layer 302 are connected with the conductive pillar 107.

The wiring layers 311w and 313w on both the surfaces of the flexible wiring substrate 301 are connected through a hole 301h that is formed by laser radiating process or photo-etching process and that is filled with a conductive substance or that is plated.

In this example, the rigid insulation resin layer 301i is disposed at two positions. Alternatively, the rigid insulation resin layer 301i may be disposed at one position or three or more positions.

In such a structure, an area of a wiring board is flexible or rigid. In the wiring board according to the eleventh embodiment of the present invention, since layers thereof are connected with the conductive pillar 107 pierced through the insulation resin layer 302i, the wiring board can be applied to a high density wiring circuit. In this case, a via land is disposed in such a manner that it protrudes so that the height of the conductive pillar 107 is smaller than the thickness of the insulation resin layer.

The hybrid wiring board according to the eleventh embodiment of the present invention can be applied to wiring boards used for various portable information units such as a portable telephone unit, a portable VCR, and a note type personal computer, in particular, to those with a high mounting density.

According to the present invention, with a hybrid wiring board of which a plurality of wiring substrate of different types or same types are laminated, the wiring density, connecting reliability, and yield can be improved.

According to the hybrid wiring board of the present invention, a plurality of flexible wiring substrates can be effectively laminated with an insulation resin layer and a conductive pillar.

According to the hybrid wiring board of the present invention, since a circuit pattern on a rigid layer and a finer circuit pattern on a flexible layer can be connected with a conductive pillar, the mechanical/electrical connecting reliability and the yield can be improved.

In addition, with a conductive pillar that electrically connects a rigid layer and a flexible layer, layers can be densely disposed. Thus, a flexible layer having a fine wiring pattern for a highly integrated semiconductor device can be connected to a rigid layer with a high reliability.

Moreover, the bonding strength between a rigid insulation layer and a flexible insulation layer can be improved. Thus, the reliability of the resultant hybrid wiring board can be remarkably improved against a thermal load and a mechanical load.

In addition, the semiconductor apparatus according to the present invention can mount a highly integrated semiconductor device with connecting terminals disposed at a high mounting density. Thus, a semiconductor apparatus that is small and thin can be accomplished. In addition, according to the present invention, a semiconductor apparatus that can mount a highly integrated semiconductor device and that has a high connecting reliability to a mother board can be accomplished.

In addition, according to the present invention, a flexible wiring substrate that is suitable for a laminate of layers can be accomplished. In particular, a flexible substrate with a high bonding strength to a rigid wiring substrate or another flexible substrate can be accomplished.

Moreover, according to the present invention, particularly, a rigid wiring substrate and a flexible wiring substrate can be electrically and mechanically connected with a high reliability. In addition, the bonding strength between the flexible substrate and the rigid substrate can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A hybrid wiring board, comprising:
    a first wiring substrate having a first face and a second face, the first wiring substrate having first wiring layers formed onto the first and second faces of the first wiring substrate, the first wiring layers being connected electrically with each other through the first wiring substrate;
    a second wiring substrate having a first face and a second face, the second wiring substrate having second wiring layers formed onto the first and second faces of the second wiring substrate, the second wiring layers being connected electrically with each other through the second wiring substrate;

an insulating resin layer interposed between and contacting the first face of the first wiring substrate and the second face of the second wiring substrate, wherein the first wiring layer on the first face of the first wiring substrate and the second wiring layer on the second face of the second wiring substrate are intruded into the insulating resin layer; and a conductive filled pillar pierced through the insulating resin layer so as to connect the first wiring layer on the first face of the first wiring substrate and the second wiring layer on the second face of the second wiring substrate.

2. A hybrid wiring board as set forth in claim 1, wherein the first wiring substrate has a rigidity and the second wiring substrate is more flexible than the first wiring substrate.

3. A hybrid wiring board as set forth in claim 1, wherein the first wiring substrate and the second wiring substrate are more flexible than the insulating resin layer.

4. A hybrid wiring board as set forth in claim 1, wherein the first wiring substrate and the second wiring substrate are more rigid than the insulating resin layer.

5. A hybrid wiring board as set forth in claim 1, wherein the insulating resin layer is more rigid than the second wiring substrate.

6. A hybrid wiring board as set forth in claim 1, wherein the first wiring layer on the first face of the first wiring substrate has a first via land, the second wiring layer on the second face of the second wiring substrate has a second via land, and the conductive filled pillar connects the fist via land and the second via land.

7. A hybrid wiring board as set forth in claim 1, wherein the second wiring substrate has at least three wiring layers and at least two insulating layers which are more flexible than the first wiring substrate.

8. A semiconductor device as set forth in claim 1, wherein the second wiring layers comprise a finer wiring pattern than a pattern of the first wiring layers.

9. A hybrid wiring board as set forth in claim 1, wherein the first wiring substrate has at least three wiring layers and at least two insulating layers.

10. A hybrid wiring board as set forth in claim 9, wherein the wiring layers of the first wiring substrate are interconnected by a conductive pillar piercing through the insulating layer of the first wiring substrate.

11. A hybrid wiring board, comprising:

a first insulating layer having a first face and a second face, the first insulating layer having a first flexibility;

first wiring layers formed onto the first and second faces of the first insulating layer, the first wiring layer on the first face of the first insulating layer having a first via land and being connected electrically with the first wiring layer on the second face of the first insulating layer through the first insulating layer;

a second insulating layer having a first face and second face, the second insulating layer having a second flexibility which is larger than the first flexibility;

second wiring layers formed onto the first and second faces of the second insulating layer, the second wiring layer on the second face of the second insulating layer having a second via land and being connected electrically with the second wiring layer of the second insulating layer through the second insulating layer;

a third insulating layer interposed between the first face of the first insulating layer and the second face of the second insulating layer, the third insulating layer having a third flexibility which is smaller than the second flexibility; and a conductive pillar pierced through the third insulating layer so as to connect the first and second via lands.

12. A hybrid wiring board as set forth in claim 11, wherein a bonding strength between the second insulating layer and the third insulating layer is larger than a bonding strength obtained when the first insulating layer and the third insulating layer are bonded.

13. A hybrid wiring board as set forth in claim 11, wherein a surface roughness of the second face of the second insulating layer is larger than a surface roughness of the first face of the second insulating layer.

14. A hybrid wiring board as set forth in claim 11, wherein a difference between a coefficient of expansion of the first insulating layer and a coefficient of expansion of the third insulating layer is larger than a difference between a coefficient of expansion of the second insulating layer and the coefficient of expansion of the third insulating layer.

15. A hybrid wiring board as set forth in claim 11, wherein the second insulating layer has a relative dielectric constant which is smaller than a relative dielectric constant of the first insulating layer and a relative dielectric constant of the third insulating layer.

16. A hybrid wiring board as set forth in claim 11, wherein the first insulating layer comprises at least one polymer selected from the group consisting of polyimide type resin, bismaleimide type polyimide resin, polyphenylene ether type resin, and glass epoxy type resin.

17. A hybrid wiring board as set forth in claim 11, wherein the second insulating layer comprises at least one polymer selected from the group consisting of polyimide type resin, polyester type resin, and polytetrafluoroethylene type resin.

18. A hybrid wiring board as set forth in claim 11, wherein the third insulating layer comprises epoxy denatured polyimide type resin.

19. A semiconductor device as set forth in claim 11, wherein the second wiring layers comprise a finer wiring pattern than a pattern of the first wiring layers.

20. A hybrid wiring board comprising:

a first board which has a flexibility, the first board having a first face and a second face, the first face having a first region and a second region;

first wiring layers formed on the first and second faces of the first board, the first wiring layers being connected electrically with each other through the first board, the first wiring layer on the first face having a first via land;

an insulating resin layer formed on the first region of the first board, the insulating resin layer having a first face and a second face, the first face is opposed to the first region of the first board, the insulating resin layer being intruded by the first via land, the insulating resin layer being more rigid than the first board;

a second wiring layer having a second via land formed on the second face of the insulating resin layer, the second via land being opposed to the first via land; and a conductive filled pillar pierced through the insulating resin layer so as to connect the first wiring layer on the first face of the first board and the second wiring layer.

21. A hybrid wiring board as set forth in claim 20, wherein the conductive filled pillar is pierced through the insulating resin layer so as to connect the first via land and the second via land.

22. A semiconductor device as set forth in claim 20, wherein the second wiring layer comprises a finer wiring pattern than a pattern of the first wiring layers.

23. A semiconductor device, comprising:
- a first wiring substrate having a first face and a second face, the first wiring substrate having first wiring layers formed on the first and second faces, the first wiring layers being connected electrically with each other through the first wiring substrate, the first wiring layer formed on the first face having a first via land, the first wiring substrate having a rigidity;
- a second wiring substrate having a first face and a second face, the second wiring substrate having second wiring layers formed on the first and second faces, the second wiring layers being connected electrically with each other through the second wiring substrate, the second wiring layer formed on the second face of the second wiring substrate having a second via land, the second wiring substrate being more flexible than the first wiring substrate;
- a semiconductor chip mounted on the first face of the second wiring substrate;
- an insulating resin layer interposed between the first face of the first wiring substrate and the second face of the second wiring substrate; and
- at least a conductive pillar pierced through the insulating resin layer so as to connect the first via land and the second via land.

24. A semiconductor device as set forth in claim 23, wherein a wettability of the second face of the second wiring substrate is larger than a wettability of the first face of the second wiring substrate.

25. A semiconductor device as set forth in claim 23, wherein the semiconductor chip is mounted on the second wiring substrate by face down bonding.

26. A semiconductor device as set forth in claim 23, wherein the second wiring substrate comprises a multi-layered wiring substrate having at least three wiring layers and at least two insulating layers.

27. A semiconductor device as set forth in claim 23, further comprising external connecting terminals formed on the second face of the first wiring substrate, the external connecting terminals being connected electrically to the semiconductor chip.

28. A semiconductor device as set forth in claim 23, wherein the second wiring layers comprise a finer wiring pattern than a pattern of the first wiring layers.

29. A semiconductor device as set forth in claim 23, wherein the first wiring substrate comprises a multi-layerd wiring substrate having at least three wiring layers and at least two insulating layers.

30. A semiconductor device as set forth in claim 29, wherein the wiring layers of the first substrate are interconnected by the conductive pillars piercing through the insulating layer of the first wiring substrate.

31. A flexible wiring substrate, comprising:
- an insulating resin film having a first face and a second face, the insulating resin film having a flexibility;
- a first wiring layer formed on the first face of the insulating resin film; and
- a second wiring layer formed on the second face of the insulating resin film;
- wherein a surface free energy of the first face of the insulating resin film is smaller than a surface free energy of the second face of the insulating resin film.

32. A flexible wiring substrate as set forth in claim 31, wherein the insulating resin film has a reformed surface in the second face.

33. A flexible wiring substrate as set forth in claim 31, wherein a contact angle $\theta$ of a water drop and the second face of the insulating resin film is larger than 60 degree.

34. A hybrid wiring board, comprising:
- a first wiring substrate having a first face and a second face, the first wiring substrate having a first wiring layer formed onto the first face;
- a second wiring substrate having a first face and a second face, the second wiring substrate having a second wiring layer formed onto the second face;
- an insulating resin layer interposed between and contacting the first face of the first wiring substrate and the second face of the second wiring substrate, wherein the first wiring layer and the second wiring layer are intruded into the insulating resin layer; and
- a conductive filled pillar having a convex side surface, said pillar pierced through the insulating resin layer so as to connect the first wiring layer and the second wiring layer.

35. A hybrid wiring board, comprising:
- a first insulating layer having a first face and a second face, the first insulating layer having a first flexibility;
- a first wiring layer formed onto the first face of the first insulating layer, the first wiring layer having a first via land;
- a second insulating layer having a first face and second face, the second insulating layer having a second flexibility which is larger than the first flexibility;
- a second wiring layer formed onto the second face of the second insulating layer, the second wiring layer having a second via land;
- a third insulating layer interposed between the first face of the first insulating layer and the second face of the second insulating layer, the third insulating layer having a third flexibility which is smaller than the second flexibility; and
- a conductive pillar having a convex side surface, said pillar pierced through the third insulating layer so as to connect the first and second via lands.

36. A hybrid wiring board comprising:
- a first board which has a flexibility, the first board having a first face and a second face, the first face having a first region and a second region;
- a first wiring layer formed on the first face of the first board, the first wiring layer having a first via land;
- an insulating resin layer formed on the first region of the first board, the insulating resin layer having a first face and a second face, the first face is opposed to the first region of the first board, the insulating resin layer being intruded by the first via land, the insulating resin layer being more rigid than the first board;
- a second wiring layer having a second via land formed on the second face of the insulating resin layer, the second via land being opposed to the first via land; and
- a conductive filled pillar having a convex side surface, said pillar pierced through the insulating resin layer so as to connect the first wiring layer and the second wiring layer.

37. A semiconductor device, comprising:
- a first wiring substrate having a first face and a second face, the first wiring substrate having a first wiring layer which has a first via land formed on the first face of the first wiring substrate, the first wiring substrate having a rigidity;

a second wiring substrate having a first face and a second face, the second wiring substrate having a second wiring layer which has a second via land formed on the second face of the second wiring substrate, the second wiring substrate being more flexible than the first wiring substrate;

a semiconductor chip mounted on the first face of the second wiring substrate;

an insulating resin layer interposed between the first face of the first wiring substrate and the second face of the second wiring substrate; and at least a conductive pillar having a convex side surface, said pillar pierced through the insulating resin layer so as to connect the first via land and the second via land.

* * * * *

UNITED STATES PATENT AND TRADEMARK OFFICE
CERTIFICATE OF CORRECTION

| | |
|---|---|
| PATENT NO. | : 6,329,610 B1 |
| DATED | : December 11, 2001 |
| INVENTOR(S) | : Takubo et al. |

It is certified that error appears in the above-identified patent and that said Letters Patent is hereby corrected as shown below:

Column 31, claim 6,
Line 29, change "fist" to -- first --.

Column 33, claim 29,
Line 50, change "multi-layerd" to -- multi-layered --.

Column 34, claim 33,
Line 6, change "60 degree" to -- 60 degrees --.

Signed and Sealed this

Sixteenth Day of April, 2002

Attest:

JAMES E. ROGAN
Attesting Officer *Director of the United States Patent and Trademark Office*